United States Patent
Kamimura

(10) Patent No.: US 12,374,540 B2
(45) Date of Patent: Jul. 29, 2025

(54) POST-CMP SEMICONDUCTOR CLEANING COMPOSITION COMPRISING AN AMINE/ALKANOLAMINE MIXTURE

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 673 days.

(21) Appl. No.: 17/679,609

(22) Filed: Feb. 24, 2022

(65) Prior Publication Data

US 2022/0254624 A1    Aug. 11, 2022

Related U.S. Application Data

(63) Continuation of application No. PCT/JP2020/030879, filed on Aug. 14, 2020.

(30) Foreign Application Priority Data

Sep. 18, 2019 (JP) ................................ 2019-169220

(51) Int. Cl.
| | |
|---|---|
| *C11D 3/30* | (2006.01) |
| *C11D 1/42* | (2006.01) |
| *C11D 3/00* | (2006.01) |
| *C11D 3/36* | (2006.01) |
| *H01L 21/02* | (2006.01) |
| *H01L 21/321* | (2006.01) |

(52) U.S. Cl.
CPC .......... *H01L 21/02052* (2013.01); *C11D 1/42* (2013.01); *C11D 3/0042* (2013.01); *C11D 3/30* (2013.01); *C11D 3/365* (2013.01); *H01L 21/3212* (2013.01)

(58) Field of Classification Search
CPC ........... C11D 3/30; C11D 1/62; C11D 3/3917; C11D 3/43; C11D 7/3209; C11D 7/3218; C11D 7/5004; C11D 2111/22
See application file for complete search history.

(56) References Cited

U.S. PATENT DOCUMENTS

| 9,045,717 | B2 | 6/2015 | Nakanishi et al. |
| 2012/0048295 | A1* | 3/2012 | Du ................... H01L 21/02071 134/3 |
| 2013/0203643 | A1* | 8/2013 | Nakanishi ............ C11D 7/3218 510/175 |
| 2016/0083675 | A1 | 3/2016 | Morita et al. |

FOREIGN PATENT DOCUMENTS

| JP | 2006-261432 A | 9/2006 |
| JP | 2011-159658 A | 8/2011 |
| JP | 2014-170927 A | 9/2014 |
| JP | 2014-212262 A | 11/2014 |

OTHER PUBLICATIONS

International Search Report dated Nov. 10, 2020 in Application No. PCT/JP2020/030879.
Written Opinion of the International Searching Authority dated Nov. 10, 2020 in Application No. PCT/JP2020/030879.
International Preliminary Report on Patentability dated Mar. 15, 2022 with a Translation of the Written Opinion of the International Searching Authority in Application No. PCT/JP2020/030879.

* cited by examiner

*Primary Examiner* — Charles I Boyer
(74) *Attorney, Agent, or Firm* — Sughrue Mion, PLLC

(57) ABSTRACT

There is provided a method of cleaning semiconductor substrates that is excellent in cleaning performance with respect to semiconductor substrates having undergone a chemical mechanical polishing process and corrosion prevention performance with respect to metal films. This method includes a cleaning step of cleaning a semiconductor substrate having undergone the CMP using a cleaning liquid. The cleaning liquid shows alkaline properties and contains: a component A that is at least one selected from the group consisting of a primary amine, a secondary amine, and a tertiary amine, provided that a compound represented by a specific formula (a) is excluded; and a component B that is a compound represented by the specific formula (a). The mass ratio of the component B content to the component A content is not more than 0.01. The cleaning liquid applied to the semiconductor substrate has a temperature of not lower than 30° C.

21 Claims, No Drawings

POST-CMP SEMICONDUCTOR CLEANING COMPOSITION COMPRISING AN AMINE/ALKANOLAMINE MIXTURE

CROSS-REFERENCE TO RELATED APPLICATIONS

This application is a Continuation of PCT International Application No. PCT/JP2020/030879 filed on Aug. 14, 2020, which claims priority under 35 U.S.C. § 119(a) to Japanese Patent Application No. 2019-169220 filed on Sep. 18, 2019. The above application is hereby expressly incorporated by reference, in its entirety, into the present application.

BACKGROUND OF THE INVENTION

The present invention relates to a method of cleaning semiconductor substrates.

BACKGROUND ART

Semiconductor devices such as charge-coupled devices (CCDs) and memories are manufactured by forming fine electronic circuit patterns on substrates using the photolithography technology. Specifically, a semiconductor device is manufactured by forming a resist film on a laminate including a metal film which is a wiring material, an etching stop layer and an interlayer dielectric layer on a substrate and carrying out a photolithography step and a dry etching step (e.g., plasma etching).

In some cases, a dry etching residue (for instance, metal components such as titanium-based metal derived from a metallic hard mask, or organic components derived from a photoresist film) remains on a substrate having undergone the dry etching step.

In manufacture of semiconductor devices, a chemical mechanical polishing (CMP) process is sometimes carried out to planarize a surface of a substrate having a metal wiring film, a barrier metal, an insulating film and the like by use of an abrasive slurry containing fine abrasive particles (e.g., silica, alumina). In the CMP process, metal components derived from the fine abrasive particles used in the CMP process and from the metal wiring film and/or the barrier metal having been polished tend to remain on the surface of the semiconductor substrate after polishing.

Since those residues may cause a short-circuit between wires and affect electrical properties of a semiconductor, a cleaning step for removing the residues from the surface of the semiconductor substrate has been conventionally carried out.

For instance, JP 2006-261432 A describes a composition for cleaning a semiconductor wafer, the composition being used in a semiconductor wafer processing step and containing (a) a fluorine compound, (b) hydrazine, (c) at least one type of basic compound other than the hydrazine, (d) at least one type of organic solvent, and (e) water.

SUMMARY OF THE INVENTION

The present inventor studied a method of cleaning a semiconductor substrate having undergone CMP by reference to JP 2006-261432 A and the like and as a result found that cleaning methods using those cleaning liquids have room for further improvement in semiconductor substrate cleaning performance and corrosion prevention performance with respect to metal films (e.g., a Cu-containing metal film, a W-containing metal film, and a Co-containing metal film) that serve as a wiring material or a plug material.

An object of the present invention is to provide a method of cleaning semiconductor substrates that is excellent in cleaning performance with respect to semiconductor substrates having undergone CMP and corrosion prevention performance with respect to metal films.

The present inventors found that the above object can be attained with the following configuration.

[1] A method of cleaning semiconductor substrates, the method comprising a cleaning step of cleaning a semiconductor substrate having undergone a chemical mechanical polishing process using a cleaning liquid, wherein the cleaning liquid shows alkaline properties and contains: a component A that is at least one selected from the group consisting of a primary amine, a secondary amine, a tertiary amine, and their salts, provided that a compound represented by Formula (a) is excluded; and a component B that is a compound represented by Formula (a), wherein a mass ratio of a content of the component B to a content of the component A is not more than 0.01, and wherein the cleaning liquid applied to the semiconductor substrate has a temperature of not lower than 30° C.,

$$NH_xR_{(3-x)} \quad (a)$$

where R represents an alkyl group having 1 to 3 carbon atoms that is composed of hydrogen atoms and a carbon atom or atoms, and x represents an integer of 0 to 3.

[2] The method according to [1], wherein the component A contains an amino alcohol.

[3] The method according to [2], wherein a first acidity constant of a conjugated acid of the amino alcohol is not less than 7.0.

[4] The method according to [2] or [3], wherein the amino alcohol has a primary amino group.

[5] The method according to any one of [2] to [4], wherein the amino alcohol has a quaternary carbon atom at an α position of an amino group.

[6] The method according to any one of [2] to [5], wherein the amino alcohol is 2-amino-2-methyl-1-propanol.

[7] The method according to any one of [1] to [6], wherein the cleaning liquid contains two or more compounds included in the component A.

[8] The method according to any one of [1] to [7], wherein the cleaning liquid further contains a chelating agent.

[9] The method according to any one of [1] to [8], wherein the cleaning liquid further contains a reducing agent.

[10] The method according to any one of [1] to [9], wherein the cleaning liquid further contains two or more reducing agents.

[11] The method according to any one of [1] to [10], wherein the cleaning liquid further contains a quaternary ammonium compound.

[12] The method according to [11], wherein the quaternary ammonium compound has an asymmetric structure.

[13] The method according to any one of [1] to [12], wherein the cleaning liquid further contains two or more quaternary ammonium compounds.

[14] The method according to any one of [1] to [13], wherein the cleaning liquid further contains a surfactant.

[15] The method according to any one of [1] to [14], wherein the cleaning liquid further contains two or more surfactants.

[16] The method according to any one of [1] to [15], wherein the semiconductor substrate has metal-containing matter containing at least one metal selected from the group consisting of cobalt, titanium, tantalum, ruthenium, and tungsten.

[17] The method according to any one of [1] to [16], wherein an amount of supply of the cleaning liquid applied to the semiconductor substrate is 500 to 2000 mL/min.
[18] The method according to any one of [1] to [17], wherein the cleaning step comprises brush scrubbing cleaning.
[19] The method according to any one of [1] to [18], wherein a cleaning time in the cleaning step is 10 to 120 seconds.
[20] The method according to any one of [1] to [19], further comprising a rinsing step of rinsing the semiconductor substrate with water after the cleaning step.

The present invention makes it possible to provide a method of cleaning semiconductor substrates that is excellent in cleaning performance with respect to semiconductor substrates having undergone CMP and corrosion prevention performance with respect to metal films.

DETAILED DESCRIPTION OF THE INVENTION

One exemplary embodiment of the invention is described below.

In this specification, a numerical range expressed in the form of "A to B" should read as a range including both the values A and B as the range's lower and upper limits, respectively.

In this specification, when a certain component comprising two or more types is present, the "content" of the certain component means the total content of the two or more types.

In this specification, "ppm" means "parts per million ($10^{-6}$)," "ppb" means "parts per billion ($10^{-9}$)," and "ppt" means "parts per trillion ($10^{-12}$)."

In compounds described in this specification, isomers (compounds with the same number of atoms but different structures), optical isomers, and isotopes may be included unless particularly limited. As isomers and isotopes, only one type or plural types may be included.

In this specification, a "C log P value" is a value obtained by calculating a common logarithm log P of a partition coefficient P between 1-octanol and water. For a method of calculating the C log P value and software used therefor, known ones can be used; in this specification, a C log P program incorporated in ChemBioDraw Ultra 12.0 manufactured by CambridgeSoft Corporation is used unless otherwise specified.

In this specification, "psi" refers to "pound-force per square inch," and 1 psi=6894.76 Pa.

The cleaning method of the present invention includes a cleaning step of cleaning a semiconductor substrate having undergone a chemical mechanical polishing process. A cleaning liquid used in the cleaning of a semiconductor substrate shows alkaline properties and contains a component A that is a specific amine compound and a component B that is a compound represented by Formula (1) to be described later at a predetermined content ratio. The temperature of the cleaning liquid applied to a semiconductor substrate (hereinafter also called "cleaning liquid temperature" or "liquid temperature") is not lower than 30° C.

The cleaning method of the present invention is characterized in that the cleaning liquid contains, in addition to the component A, the component B in an amount not more than a predetermined amount and that the cleaning liquid temperature is not lower than 30° C. The component B is a low molecular compound, has a relatively high water solubility, and has excellent speed of coordination to metal (e.g., Co, W and Cu) contained in a semiconductor substrate. Therefore, while addition of the component B contributes to improvement in cleaning performance of the cleaning liquid, the effect of the component B to improve the cleaning performance is considered to be further remarkable when the cleaning liquid temperature is high. Further, when the ratio between the content of the component B and the content of the component A having the function of protecting a metal film in the cleaning liquid is not more than a predetermined value, corrosion of a metal film caused by the component B under a high temperature condition is considered to be suppressed, thus leading to more excellent corrosion prevention performance.

[Cleaning Liquid]

The cleaning liquid used in the cleaning method of the invention (hereinafter also simply called "cleaning liquid") contains the component A and the component B. The mass ratio of the component B content to the component A content is not more than 0.01. Further, the cleaning liquid shows alkaline properties.

Each component contained in the cleaning liquid is described below.

[Component A]

The component A is at least one amine compound selected from the group consisting of a primary amine having a primary amino group (—NH$_2$) in the molecule, a secondary amine having a secondary amino group (>NH) in the molecule, a tertiary amine having a tertiary amino group (>N—) in the molecule, and their salts. Note that the component A does not include the component B to be described later.

The component A has the function of ensuring the cleaning performance of the cleaning liquid while suppressing corrosion of a metal film (preferably, a metal film containing Cu, W and/or Co) on a substrate.

For the component A, examples thereof include an amino alcohol, an amine compound having a cyclic structure, and other monoamine or polyamine compounds.

For a salt of a primary amine, a secondary amine or a tertiary amine, one example is a salt thereof with an inorganic acid in which at least one non-metal selected from the group consisting of Cl, S, N and P is bonded to hydrogen, and preferred is a hydrochloride, a sulfate, or a nitrate.

<Amino Alcohol>

The component A preferably contains an amino alcohol because this leads to more excellent cleaning performance. The amino alcohol is, of amine compounds, a compound further having at least one hydroxyalkyl group in the molecule.

The amino alcohol may have any of primary to tertiary amino groups and preferably has a primary amino group because this leads to excellent cleaning properties.

A first acidity constant (hereinafter referred to also as "pKa1") of a conjugated acid of the amino alcohol is preferably not less than 7.0 and more preferably not less than 9.0 because this leads to good cleaning properties and excellent damage resistance. The upper limit thereof is not particularly limited and is preferably not more than 12.0.

The amino alcohol preferably has a quaternary carbon atom at the a position of the amino group (a primary amino group, a secondary amino group or a tertiary amino group) because this leads to excellent temporal stability. That is, a carbon atom bonded to the amino group is preferably not bonded to a hydrogen atom but bonded to three organic groups.

Examples of the amino alcohol include monoethanolamine (MEA) (pKa1 of a conjugated acid: 9.55), 2-amino-2-methyl-1-propanol (AMP) (pKa1 of a conjugated acid: 9.72), diethanolamine (DEA) (pKa1 of a conjugated acid: 8.88), triethanolamine (TEA) (pKa1 of a conjugated acid: 7.80), diethylene glycol amine (DEGA) (pKa1 of a conjugated acid: 9.02), tris(hydroxymethyl)aminomethane (Tris) (pKa1 of a conjugated acid: 8.30), 2-(methylamino)-2-methyl-1-propanol (N-MAMP) (pKa1 of a conjugated acid: 9.70), dimethylbis(2-hydroxylethyl)ammonium hydroxide (AH212) (pKa1 of a conjugated acid: >10.0), and 2-(2-aminoethylamino)ethanol (pKa1 of a conjugated acid: 7.21).

Of these, AMP, N-MAMP, MEA, DEA, Tris or DEGA is preferred, and AMP, MEA, DEA or DEGA is more preferred.

When the cleaning liquid contains the amino alcohol as the component A, one amino alcohol may be contained alone, or two or more amino alcohols may be contained in combination; it is preferable to contain two or more amino alcohols because this leads to more excellent corrosion prevention performance.

<Amine Compound Having Cyclic Structure>

Of an amine compound having a cyclic structure, the cyclic structure is not particularly limited, and examples thereof include a heterocyclic ring in which at least one of atoms constituting the ring is a nitrogen atom (nitrogen-containing heterocyclic ring).

Examples of the amine compound having a cyclic structure include an azole compound, a pyridine compound, a pyrazine compound, a pyrimidine compound, a piperazine compound, and a cyclic amidine compound.

The azole compound is a compound having a five-membered heterocyclic ring containing at least one nitrogen atom and having aromatic properties. The number of nitrogen atoms included in the five-membered heterocyclic ring of the azole compound is not particularly limited, and is preferably 2 to 4 and more preferably 3 or 4.

Examples of the azole compound include an imidazole compound, a pyrazole compound, a thiazole compound, a triazole compound, and a tetrazole compound.

For the azole compound, a triazole compound or a tetrazole compound is preferred, and 1,2,4-triazole, 5-aminotetrazole, or 1H-tetrazole is more preferred.

The pyridine compound is a compound having a six-membered heterocyclic ring (pyridine ring) containing one nitrogen atom and having aromatic properties.

Examples of the pyridine compound include pyridine, 3-aminopyridine, 4-aminopyridine, 3-hydroxypyridine, 4-hydroxypyridine, 2-acetamidopyridine, 2-cyanopyridine, 2-carboxypyridine, and 4-carboxypyridine.

The pyrazine compound is a compound having a six-membered heterocyclic ring (pyrazine ring) containing two nitrogen atoms at the para positions and having aromatic properties, and the pyrimidine compound is a compound having a six-membered heterocyclic ring (pyrimidine ring) containing two nitrogen atoms at the meta positions and having aromatic properties.

Examples of the pyrazine compound include pyrazine, 2-methylpyrazine, 2,5-dimethylpyrazine, 2,3,5-trimethylpyrazine, 2,3,5,6-tetramethylpyrazine, 2-ethyl-3-methylpyrazine, and 2-amino-5-methylpyrazine, with pyrazine being preferred.

Examples of the pyrimidine compound include pyrimidine, 2-methylpyrimidine, 2-aminopyrimidine, and 4,6-dimethylpyrimidine, with 2-aminopyrimidine being preferred.

The piperazine compound is a compound having a six-membered heterocyclic ring (piperazine ring) in which opposed —CH— groups in a cyclohexane ring are substituted with nitrogen atoms. The piperazine compound is favorable because it leads to excellent storage stability of the cleaning liquid.

The piperazine compound may have a substituent on the piperazine ring. Examples of the substituent include a hydroxy group, an alkyl group having 1 to 4 carbon atoms that may have a hydroxy group, and an aryl group having 6 to 10 carbon atoms.

Examples of the piperazine compound include piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 1-phenylpiperazine, 2-hydroxypiperazine, 2-hydroxymethylpiperazine, 1-(2-hydroxyethyl)piperazine (HEP), N-(2-aminoethyl)piperazine (AEP), 1,4-bis(2-hydroxyethyl)piperazine (BHEP), 1,4-bis(2-aminoethyl)piperazine (BAEP), and 1,4-bis(3-aminopropyl)piperazine (BAPP), with preferred being piperazine, 1-methylpiperazine, 2-methylpiperazine, HEP, AEP, BHEP, BAEP, or BAPP, and more preferred being HEP, AEP, BHEP, BAEP, or BAPP.

The cyclic amidine compound is a compound having a heterocyclic ring including an amidine structure (>N—C=N—) in the ring.

The number of atoms constituting the heterocyclic ring of the cyclic amidine compound is not particularly limited and is preferably five or six and more preferably six.

Examples of the cyclic amidine compound include diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimido[1.2-a]azocine, 3,4,6,7,8,9-hexahydro-2H-pyrido[1.2-a]pyrimidine, 2,5,6,7-terahydro-3H-pyrrolo[1.2-a]imidazole, 3-ethyl-2,3,4,6,7,8,9,10-octahydropyrimido[1.2-a]azepine, and creatinine, with DBU or DBN being preferred.

Examples of the amine compound having a cyclic structure include, in addition to the foregoing examples, a compound having a five-membered heterocyclic ring with no aromatic properties such as 1,3-dimethyl-2-imidazolidinone or imidazolidinethione, and a compound having a seven-membered ring containing a nitrogen atom(s).

For the amine compound having a cyclic structure, preferred is a triazole compound, a tetrazole compound, a piperazine compound or a cyclic amidine compound, and more preferred is a piperazine compound.

<Monoamine Compound>

Examples of the monoamine compound other than the amino alcohol and the amine compound having a cyclic structure include benzylamine, diethylamine, n-butylamine, 3-methoxypropylamine, tert-butylamine, n-hexylamine, cyclohexylamine, n-octylamine, 2-ethylhexylamine, and 4-(2-aminoethyl)morpholine (AEM).

<Polyamine Compound>

Examples of the polyamine compound other than the amino alcohol and the amine compound having a cyclic structure include alkylene diamines such as ethylenediamine (EDA), 1,3-propanediamine (PDA), 1,2-propanediamine, 1,3-butanediamine, and 1,4-butanediamine, and polyalkylene polyamines such as diethylenetriamine (DETA), triethylenetriamine (TETA), and tetraethylenepentamine.

For the component A, the amine compounds described in paragraphs [0034] to [0056] of the description of WO 2013/162020 can be applied, and the contents thereof are incorporated in the present specification.

The component A preferably further has one or more hydrophilic groups in addition to one of the primary to tertiary amino groups because this leads to excellent cleaning performance. For the hydrophilic group, examples thereof include primary to tertiary amino groups, a hydroxy group, and a carboxyl group, with preferred being primary to tertiary amino groups or a hydroxy group.

Examples of the component A as above include a polyamine compound having two or more primary to tertiary amino groups, an amino alcohol having one or more primary to tertiary amino groups and one or more hydroxy groups, and of amine compounds having a cyclic structure, a compound having two or more hydrophilic groups.

The upper limit of the total number of hydrophilic groups in the component A is not particularly limited and is preferably not more than five and more preferably not more than four.

The C log P value of the component A is preferably not more than 0.0, more preferably not more than −0.5 and still more preferably not more than −1.0 because, with such a C log P value, a complex having high water solubility can be formed with metal contained in a residue and this leads to improved cleaning performance of the cleaning liquid. At the same time, the C log P value of the component A is preferably not less than −3.0, more preferably not less than −2.8 and still more preferably not less than −2.5 because this leads to improved corrosion prevention performance. The C log P value of the component A is preferably −3.0 to 0.0, more preferably −2.8 to −0.5 and still more preferably −2.5 to −1.0 because this allows cleaning performance and corrosion prevention performance of the cleaning liquid to be excellent in good balance.

For the component A contained in the cleaning liquid, preferred is monoethanolamine (MEA) (C log P value: −1.31), 2-amino-2-methyl-1-propanol (AMP) (C log P value: −0.61), 2-(methylamino)-2-methyl-1-propanol (N-MAMP) (C log P value: −0.27), diethanolamine (DEA) (C log P value: −1.50), diethylene glycol amine (DEGA) (C log P value: −1.37), tris(hydroxymethyl)aminomethane (Tris) (C log P value: −1.38), ethylenediamine (EDA) (C log P value: −2.04), 1,3-propanediamine (PDA) (C log P value: −1.42), diethylenetriamine (DETA) (C log P value: −1.87), triethylenetetramine (TETA) (C log P value: −2.18), N-(2-aminoethyl)piperazine (AEP) (C log P value: −0.86), 1,4-bis(2-hydroxyethyl)piperazine (BHEP) (C log P value: −1.14), 1,4-bis(3-aminopropyl)piperazine (BAPP) (C log P value: −1.43), or bis(aminopropyl)ethylenediamine (BAPEDA) (C log P value: −1.45).

In particular, in terms of providing more excellent corrosion prevention performance with respect to a Cu- or Co-containing metal film, MEA, AMP, N-MAMP, DEA, DEGA, EDA, PDA, DETA, TETA, AEP, BHEP, BAPP or BAPEDA is more preferred, and MEA, PDA, DETA, TETA, AEP, BHEP, BAPP or BAPEDA is even more preferred.

In terms of providing more excellent corrosion prevention performance with respect to a W-containing metal film, MEA, AMP, N-MAMP, DEA, DEGA, Tris, PDA, DETA, TETA, AEP, BHEP, BAPP or BAPEDA is more preferred, and DEGA, Tris, PDA, DETA, TETA, AEP, BHEP, BAPP or BAPEDA is even more preferred.

The cleaning liquid may contain one component A alone or two or more components A in combination. The cleaning liquid preferably contains two or more compounds included in the component A because this leads to more excellent corrosion prevention performance.

The component A content is preferably 0.05 to 15 mass % and more preferably 0.5 to 12 mass % based on the total mass of the cleaning liquid.

[Component B]

The cleaning liquid contains the component B that is a compound represented by Formula (a):

 (a)

where R represents an alkyl group having 1 to 3 carbon atoms that is composed of hydrogen atoms and a carbon atom(s), and x represents an integer of 0 to 3.

The component B that is a low molecular compound, has a relatively high water solubility, and has excellent speed of coordination to metal (e.g., Co, W and Cu) as described above has the function of improving cleaning performance of the cleaning liquid. The cleaning performance provided by the component B is considered to be further remarkable when the cleaning liquid at 30° C. or higher is applied to a semiconductor substrate.

The alkyl group having 1 to 3 carbon atoms is not particularly limited as long as it is an alkyl group having 1 to 3 carbon atoms that is composed of hydrogen atoms and a carbon atom(s), and favorable examples thereof include a methyl group, an ethyl group, an n-propyl group, and an isopropyl group, with an ethyl group or an n-propyl group being preferred.

For x, an integer of 0 to 2 is preferred in terms of providing more excellent corrosion prevention performance and cleaning performance with respect to a Cu-containing metal film, whereas 3 is preferred in terms of providing more excellent corrosion prevention performance with respect to a W-containing metal film.

For the component B, examples thereof include ammonia, methylamine, ethylamine, propylamine, dimethylamine, diethylamine, trimethylamine, and triethylamine.

In particular, in terms of providing more excellent corrosion prevention performance and cleaning performance with respect to a Cu-containing metal film, preferred is a component B having an alkyl group with 1 to 3 carbon atoms, more preferred is methylamine, ethylamine, propylamine, dimethylamine, diethylamine, trimethylamine, or triethylamine, and even more preferred is ethylamine, propylamine, diethylamine, or triethylamine.

In terms of providing more excellent corrosion prevention performance with respect to a W-containing metal film, ammonia is preferred.

The cleaning liquid used in the cleaning method of the invention contains the component A and the component B such that the mass ratio of the component B content to the component A content is not more than 0.01. By limiting the ratio of content between the component B and the component A in the cleaning liquid to a value equal to or less than a predetermined value, both metal film corrosion prevention performance and cleaning performance are exhibited even under a high temperature condition under which the component B easily causes corrosion of a metal film.

The mass ratio of the component B content to the component A content is preferably not more than 0.005 because this leads to more excellent corrosion prevention performance with respect to a W- or Co-containing metal film and more excellent cleaning performance. The lower limit thereof is not particularly limited and is preferably not less than 0.00001, more preferably not less than 0.0001 and even more preferably not less than 0.0005 because this leads to more excellent cleaning performance.

The cleaning liquid may contain one component B alone or two or more components B in combination.

The component B content is preferably 0.00001 to 0.1 mass % and more preferably 0.0001 to 0.05 mass % based on the total mass of the cleaning liquid.

[Water]

The cleaning liquid preferably contains water as a solvent.

The type of water used in the cleaning liquid is not particularly limited as long as it has no bad influence on a semiconductor substrate, and distilled water, deionized water and pure water (ultrapure water) are usable. Pure water is preferred because it hardly contains impurities and its influence on a semiconductor substrate is smaller in a semiconductor substrate manufacturing process.

The water content of the cleaning liquid is not particularly limited and is for instance 1 to 99 mass % based on the total mass of the cleaning liquid.

[Optional Component]

The cleaning liquid may contain other optional components in addition to the foregoing components. Optional components are described below.

<Chelating Agent>

The cleaning liquid preferably contains a chelating agent.

The chelating agent used in the cleaning liquid is a compound that has a function of chelating with metal contained in a residue in a cleaning step of a semiconductor substrate. In particular, a compound having in the molecule two or more functional groups (coordination groups) that form coordinate bonds with metal ions. It should be noted that the chelating agent does not include either the compound A or the compound B.

Examples of the coordination group that the chelating agent has include an acid group and a cationic group. Examples of the acid group include a carboxy group, a phosphonic acid group, a sulfo group, and a phenolic hydroxy group. One example of the cationic group is an amino group.

The chelating agent used in the cleaning liquid preferably has an acid group as the coordination group and more preferably has at least one coordination group selected from a carboxy group and a phosphonic acid group.

Examples of the chelating agent include an organic chelating agent and an inorganic chelating agent.

The organic chelating agent is a chelating agent constituted of an organic compound, and examples thereof include a carboxylic acid-based chelating agent having a carboxy group as the coordination group, and a phosphonic acid-based chelating agent having a phosphonic acid group as the coordination group.

Examples of the inorganic chelating agent include condensed phosphoric acid and salts thereof.

For the chelating agent, the organic chelating agent is preferred, and an organic chelating agent having at least one coordination group selected from a carboxy group and a phosphonic acid group is more preferred.

The chelating agent is preferably of low molecular weight. The molecular weight of the chelating agent is preferably not more than 600, more preferably not more than 450 and even more preferably not more than 300.

When the chelating agent is the organic chelating agent, the number of carbon atoms is preferably not more than 15, more preferably not more than 12 and even more preferably not more than 8.

(Carboxylic Acid-Based Chelating Agent)

The carboxylic acid-based chelating agent is a chelating agent having a carboxy group as the coordination group in the molecule, and examples thereof include an aminopolycarboxylic acid-based chelating agent, an amino acid-based chelating agent, a hydroxy carboxylic acid-based chelating agent, and an aliphatic carboxylic acid-based chelating agent.

Examples of the aminopolycarboxylic acid-based chelating agent include butylene diamine tetraacetic acid, diethylenediamine pentaacetic acid (DTPA), ethylenediamine tetrapropionic acid, triethylenetetramine hexacetic acid, 1,3-diamino-2-hydroxypropane-N,N,N',N'-tetraacetic acid, propylenediamine tetraacetic acid, ethylenediamine tetraacetic acid (EDTA), trans-1,2-diaminocyclohexane tetraacetic acid, ethylenediamine diacetic acid, ethylenediamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, 1,4,7,10-tetraazacyclododecane-tetraacetic acid, diaminopropanol tetraacetic acid, (hydroxyethyl)ethylenediamine triacetic acid, and iminodiacetic acid (IDA).

Of these, diethylenetriamine pentaacetic acid (DTPA), ethylenediamine tetraacetic acid (EDTA), trans-1,2-diaminocyclohexane tetraacetic acid, or iminodiacetic acid (IDA) is preferable.

Examples of the amino acid-based chelating agent include glycine, serine, α-alanine (2-aminopropionic acid), β-alanine (3-aminopropionic acid), lysine, leucine, isoleucine, cystine, cysteine, ethionine, threonine, tryptophan, tyrosine, valine, histidine, histidine derivatives, asparagine, aspartic acid, glutamine, glutamic acid, arginine, proline, methionine, phenylalanine, the compounds described in paragraphs [0021] to [0023] of JP 2016-086094 A, and salts thereof. For the histidine derivatives, the compounds described in JP 2015-165561 A and JP 2015-165562 A can be applied, and the contents thereof are incorporated in the present specification. Examples of the salts include alkali metal salts such as a sodium salt and a potassium salt, ammonium salts, carbonates, and acetates.

For the amino acid-based chelating agent, a sulfur-containing amino acid containing a sulfur atom is preferred in terms of providing excellent corrosion prevention performance with respect to a metal film (particularly, a Cu-containing film or a Co-containing film). Examples of the sulfur-containing amino acid include cystine, cysteine, ethionine, and methionine. Of these, cystine or cysteine is preferred.

Examples of the hydroxy carboxylic acid-based chelating agent include malic acid, citric acid, glycolic acid, gluconic acid, heptonic acid, tartaric acid, and lactic acid, with citric acid or tartaric acid being preferred.

Examples of the aliphatic carboxylic acid-based chelating agent include oxalic acid, malonic acid, succinic acid, glutaric acid, adipic acid, pimelic acid, sebacic acid, and maleic acid.

For the carboxylic acid-based chelating agent, preferred is the aminopolycarboxylic acid-based chelating agent, the amino acid-based chelating agent, or the hydroxy carboxylic acid-based chelating agent, more preferred is DTPA, EDTA, trans-1,2-diaminocyclohexane tetraacetic acid, IDA, arginine, glycine, β-alanine, citric acid, tartaric acid, or oxalic acid, and even more preferred is DTPA, IDA, glycine, or citric acid.

(Phosphonic Acid-Based Chelating Agent)

The phosphonic acid-based chelating agent is a chelating agent having at least one phosphonic acid group in the molecule. Examples of the phosphonic acid-based chelating agent include compounds represented by Formulae (1), (2) and (3) below.

[Chemical Formula 1]

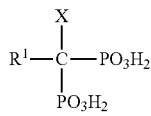

(1)

In the formula, X represents a hydrogen atom or a hydroxy group, and $R^1$ represents a hydrogen atom or an alkyl group having 1 to 10 carbon atoms.

The alkyl group having 1 to 10 carbon atoms represented by $R^1$ in Formula (1) may be any of linear, branched and cyclic groups.

For $R^1$ in Formula (1), an alkyl group having 1 to 6 carbon atoms is preferred, and a methyl group, an ethyl group, an n-propyl group, or an isopropyl group is more preferred.

It should be noted that n– represents a normal-type in specific examples of an alkyl group described in the present specification.

For X in Formula (1), a hydroxy group is preferred.

For the phosphonic acid-based chelating agent represented by Formula (1), preferred is ethylidenediphosphonic acid, 1-hydroxyethylidene-1,1'-diphosphonic acid (HEDP), 1-hydroxypropylidene-1,1'-diphosphonic acid, or 1-hydroxybutylidene-1,1'-diphosphonic acid.

[Chemical Formula 2]

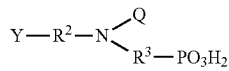

(2)

In the formula, Q represents a hydrogen atom or $-R^3-PO_3H_2$, $R^2$ and $R^3$ each independently represent an alkylene group, and Y represents a hydrogen atom, $-R^3-PO_3H_2$, or a group represented by Formula (4) below.

[Chemical Formula 3]

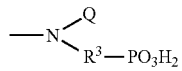

(4)

In the formula, Q and $R^3$ are the same as those in Formula (2).

Examples of the alkylene group represented by $R^2$ in Formula (2) include a linear or branched alkylene group having 1 to 12 carbon atoms.

For the alkylene group represented by $R^2$, a linear or branched alkylene group having 1 to 6 carbon atoms is preferred, a linear or branched alkylene group having 1 to 4 carbon atoms is more preferred, and an ethylene group is even more preferred.

For the alkylene group represented by $R^3$ in Formulae (2) and (4), examples thereof include a linear or branched alkylene group having 1 to 10 carbon atoms, with a linear or branched alkylene group having 1 to 4 carbon atoms being preferred, a methylene group or an ethylene group being more preferred, and a methylene group being even more preferred.

For Q in Formulae (2) and (4), $-R^3-PO_3H_2$ is preferred.

For Y in Formula (2), $-R^3-PO_3H_2$ or a group represented by Formula (4) is preferred, and a group represented by Formula (4) is more preferred.

For the phosphonic acid-based chelating agent represented by Formula (2), preferred is ethylaminobis(methylenephosphonic acid), dodecylaminobis(methylenephosphonic acid), nitrilotris(methylenephosphonic acid) (NTPO), ethylenediamine bis(methylenephosphonic acid) (EDDPO), 1,3-propylenediamine bis(methylenephosphonic acid), ethylenediamine tetra(methylenephosphonic acid) (EDTPO), ethylenediamine tetra(ethylenephosphonic acid), 1,3-propylenediamine tetra(methylenephosphonic acid) (PDTMP), 1,2-diaminopropane tetra(methylenephosphonic acid), or 1,6-hexamethylenediamine tetra(methylenephosphonic acid).

[Chemical Formula 4]

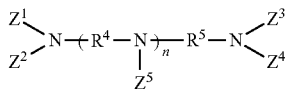

(3)

In the formula, $R^4$ and $R^5$ each independently represent an alkylene group having 1 to 4 carbon atoms, n represents an integer of 1 to 4, and at least four of $Z^1$ to $Z^4$ and n moieties of $Z^5$s represent a phosphonic acid group-containing alkyl group while the remainder represents an alkyl group.

The alkylene group having 1 to 4 carbon atoms represented by $R^4$ and $R^5$ in Formula (3) may be a linear or branched group. Examples of the alkylene group having 1 to 4 carbon atoms represented by $R^4$ and $R^5$ include a methylene group, an ethylene group, a propylene group, a trimethylene group, an ethylmethylene group, a tetramethylene group, a 2-methylpropylene group, a 2-methyltrimethylene group, and an ethylethylene group, with an ethylene group being preferred.

For n in Formula (3), 1 or 2 is preferred.

Examples of an alkyl group in the alkyl group and the phosphonic acid group-containing alkyl group represented by $Z^1$ to $Z^5$ in Formula (3) include a linear or branched alkyl group having 1 to 4 carbon atoms, with a methyl group being preferred.

The number of phosphonic acid groups in the phosphonic acid group-containing alkyl group represented by $Z^1$ to $Z^5$ is preferably one or two and more preferably one.

Examples of the phosphonic acid group-containing alkyl group represented by $Z^1$ to $Z^5$ include a linear or branched alkyl group with 1 to 4 carbon atoms having one or two phosphonic acid groups, with a (mono)phosphonomethyl group or a (mono)phosphonoethyl group being preferred, and a (mono)phosphonomethyl group being more preferred.

For $Z^1$ to $Z^5$ in Formula (3), it is preferable that each of $Z^1$ to $Z^4$ and n moieties of $Z^5$s be the foregoing phosphonic acid group-containing alkyl group.

For the phosphonic acid-based chelating agent represented by Formula (3), preferred is diethylenetriamine penta(methylenephosphonic acid) (DEPPO), diethylenetriamine penta(ethylenephosphonic acid), triethylenetetramine hexa(methylenephosphonic acid), or triethylenetetramine hexa(ethylenephosphonic acid).

For the phosphonic acid-based chelating agent used in the cleaning liquid, not only the phosphonic acid-based chelating agents represented by Formulae [1], [2] and [3] above but also the compounds described in paragraphs [0026] to [0036] of the description of WO 2018/020878 and the compounds ((co)polymers) described in paragraphs [0031] to [0046] of the description of WO 2018/030006 can be applied, and the contents thereof are incorporated in the present specification.

For the phosphonic acid-based chelating agent used in the cleaning liquid, those compounds listed as preferable specific examples of the phosphonic acid-based chelating agents represented by Formulae (1), (2) and (3) above are preferred, HEDP, NTPO, EDTPO, or DEPPO is more preferred, and HEDP or EDTPO is even more preferred.

The phosphonic acid-based chelating agents may be used singly or in combination of two or more.

A commercial phosphonic acid-based chelating agent may contain water such as distilled water, deionized water and ultrapure water in addition to a phosphonic acid-based chelating agent, and it is no problem to use such a phosphonic acid-based chelating agent containing water.

Examples of the condensed phosphoric acid and salts thereof which are the inorganic chelating agents include pyrophosphoric acid and salts thereof, metaphosphoric acid and salts thereof, tripolyphosphoric acid and salts thereof, and hexametaphosphoric acid and salts thereof.

For the chelating agent, preferred is DTPA, EDTA, trans-1,2-diaminocyclohexane tetraacetic acid, IDA, arginine, glycine, β-alanine, citric acid, tartaric acid, oxalic acid, HEDP, NTPO, EDTPO, or DEPPO, and more preferred is DTPA, EDTA, IDA, glycine, citric acid, or EDTPO.

In terms of providing excellent defect suppression performance with respect to a metal film (particularly, a Cu-containing film or a Co-containing film), a sulfur-containing amino acid is preferred, and cystine or cysteine is more preferred.

The chelating agents may be used singly or in combination of two or more.

The chelating agent content (the total content when two or more chelating agents are contained) of the cleaning liquid is not particularly limited and is preferably not less than 0.001 mass %, more preferably not less than 0.01 mass % and even more preferably not less than 0.05 mass % based on the total mass of the cleaning liquid because this leads to more excellent performance in suppressing a change in the pH caused by dilution. The upper limit of the chelating agent content is not particularly limited and is, based on the total mass of the cleaning liquid, preferably not more than 25 mass %, with not more than 18 mass % being more preferred because this leads to more excellent corrosion prevention performance, and not more than 10 mass % being even more preferred because this leads to even more excellent corrosion prevention performance with respect to a Cu- or Co-containing metal film.

The mass ratio of the component A content to the chelating agent content is preferably not more than 1000, more preferably not more than 100 and even more preferably not more than 50 because this leads to more excellent performance in suppressing a change in the pH caused by dilution. At the same time, the mass ratio of the component A content to the chelating agent content is preferably not less than 0.2, with more than 0.4 being more preferred because this leads to more excellent corrosion prevention performance, and not less than 0.6 being even more preferred because this leads to even more excellent corrosion prevention performance with respect to a Cu- or Co-containing metal film.

<Surfactant>

The cleaning liquid may contain a surfactant.

The surfactant is not particularly limited as long as it is a compound having a hydrophilic group and a hydrophobic group (lipophilic group) in the molecule, and examples thereof include an anionic surfactant, a cationic surfactant, a nonionic surfactant, and an amphoteric surfactant. In the present specification, the surfactant does not include any of the component A, the component B and the chelating agent described above.

It is preferable for the cleaning liquid to contain the surfactant because this leads to more excellent corrosion prevention performance with respect to a metal film and more excellent removability of fine abrasive particles.

In many cases, the surfactant has a hydrophobic group selected from an aliphatic hydrocarbon group, an aromatic hydrocarbon group, and combinations thereof. The hydrophobic group that the surfactant has is not particularly limited; when the hydrophobic group contains an aromatic hydrocarbon group, the number of carbon atoms is preferably 6 or more and more preferably 10 or more. When the hydrophobic group contains no aromatic hydrocarbon group and is constituted only of an aliphatic hydrocarbon group, the number of carbon atoms is preferably 9 or more, more preferably 13 or more, and even more preferably 16 or more. The upper limit of the number of carbon atoms of the hydrophobic group is not particularly limited and is preferably not more than 20 and more preferably not more than 18.

(Anionic Surfactant)

Examples of the anionic surfactant that is usable in the cleaning liquid include a phosphoric acid ester-based surfactant having a phosphoric acid ester group, a phosphonic acid-based surfactant having a phosphonic acid group, a sulfonic acid-based surfactant having a sulfo group, a carboxylic acid-based surfactant having a carboxy group, and a sulfuric acid ester-based surfactant having a sulfuric acid ester group, with those groups each acting as a hydrophilic group (acid group).

—Phosphoric Acid Ester-Based Surfactant—

Examples of the phosphoric acid ester-based surfactant include phosphoric acid ester (alkyl ether phosphoric acid ester), polyoxyalkylene ether phosphoric acid ester, and salts thereof. While the phosphoric acid ester and the polyoxyalkylene ether phosphoric acid ester usually include both a monoester and a diester, a monoester or a diester may be used alone.

Examples of the salts of the phosphoric acid ester-based surfactant include a sodium salt, a potassium salt, an ammonium salt, and an organic amine salt.

A monovalent alkyl group that the phosphoric acid ester and the polyoxyalkylene ether phosphoric acid ester have is not particularly limited and is preferably an alkyl group having 2 to 24 carbon atoms, more preferably an alkyl group having 6 to 18 carbon atoms, and even more preferably an alkyl group having 12 to 18 carbon atoms.

A divalent alkylene group that the polyoxyalkylene ether phosphoric acid ester has is not particularly limited and is preferably an alkylene group having 2 to 6 carbon atoms and more preferably an ethylene group or a 1,2-propanediyl group. The number of repeats of an oxyalkylene group in the polyoxyalkylene ether phosphoric acid ester is preferably 1 to 12 and more preferably 1 to 6.

For the phosphoric acid ester-based surfactant, preferred is octyl phosphoric acid ester, lauryl phosphoric acid ester, tridecyl phosphoric acid ester, myristyl phosphoric acid ester, cetyl phosphoric acid ester, stearyl phosphoric acid ester, polyoxyethylene octyl ether phosphoric acid ester, polyoxyethylene lauryl ether phosphoric acid ester, or polyoxyethylene tridecyl ether phosphoric acid ester, more preferred is lauryl phosphoric acid ester, tridecyl phosphoric acid ester, myristyl phosphoric acid ester, cetyl phosphoric acid ester, or stearyl phosphoric acid ester, and even more preferred is lauryl phosphoric acid ester, cetyl phosphoric acid ester, or stearyl phosphoric acid ester.

For the phosphoric acid ester-based surfactant, the compounds described in paragraphs [0012] to [0019] of JP 2011-040502 A can also be applied, and the contents thereof are incorporated in the present specification.

—Phosphonic Acid-Based Surfactant—

Examples of the phosphonic acid-based surfactant include alkyl phosphonic acid and polyvinyl phosphonic acid as well as aminomethyl phosphonic acid described in JP 2012-057108 A.

—Sulfonic Acid-Based Surfactant—

Examples of the sulfonic acid-based surfactant include alkyl sulfonic acid, alkylbenzene sulfonic acid, alkylnaphthalene sulfonic acid, alkyl diphenyl ether disulfonic acid, alkyl methyl taurine, sulfosuccinic acid diester, polyoxyalkylene alkyl ether sulfonic acid, and salts thereof.

A monovalent alkyl group that the sulfonic acid-based surfactant has is not particularly limited and is preferably an alkyl group having 2 to 24 carbon atoms and more preferably an alkyl group having 6 to 18 carbon atoms.

A divalent alkylene group that the polyoxyalkylene alkyl ether sulfonic acid has is not particularly limited and is preferably an ethylene group or a 1,2-propanediyl group. The number of repeats of an oxyalkylene group in the polyoxyalkylene alkyl ether sulfonic acid is preferably 1 to 12 and more preferably 1 to 6.

Specific examples of the sulfonic acid-based surfactant include hexanesulfonic acid, octanesulfonic acid, decanesulfonic acid, dodecanesulfonic acid, toluenesulfonic acid, cumenesulfonic acid, octylbenzenesulfonic acid, dodecylbenzenesulfonic acid (DBSA), dinitrobenzenesulfonic acid (DNBSA), and lauryl dodecylphenyl ether disulfonic acid (LDPEDSA). Of these, dodecanesulfonic acid, DBSA, DNBSA, or LDPEDSA is preferred, and DBSA, DNBSA, or LDPEDSA is more preferred.

—Carboxylic Acid-Based Surfactant—

Examples of the carboxylic acid-based surfactant include alkyl carboxylic acid, alkylbenzene carboxylic acid, and polyoxyalkylene alkyl ether carboxylic acid, and salts thereof.

A monovalent alkyl group that the carboxylic acid-based surfactant has is not particularly limited and is preferably an alkyl group having 7 to 25 carbon atoms and more preferably an alkyl group having 11 to 17 carbon atoms.

A divalent alkylene group that the polyoxyalkylene alkyl ether carboxylic acid has is not particularly limited and is preferably an ethylene group or a 1,2-propanediyl group. The number of repeats of an oxyalkylene group in the polyoxyalkylene alkyl ether carboxylic acid is preferably 1 to 12 and more preferably 1 to 6.

Specific examples of the carboxylic acid-based surfactant include lauric acid, myristic acid, palmitic acid, stearic acid, polyoxyethylene lauryl ether acetic acid, and polyoxyethylene tridecyl ether acetic acid.

—Sulfuric Acid Ester-Based Surfactant—

Examples of the sulfuric acid ester-based surfactant include sulfuric acid ester (alkyl ether sulfuric acid ester), polyoxyalkylene ether sulfuric acid ester, and salts thereof.

A monovalent alkyl group that the sulfuric acid ester and the polyoxyalkylene ether sulfuric acid ester have is not particularly limited and is preferably an alkyl group having 2 to 24 carbon atoms and more preferably an alkyl group having 6 to 18 carbon atoms.

A divalent alkylene group that the polyoxyalkylene ether sulfuric acid ester has is not particularly limited and is preferably an ethylene group or a 1,2-propanediyl group. The number of repeats of an oxyalkylene group in the polyoxyalkylene ether sulfuric acid ester is preferably 1 to 12 and more preferably 1 to 6.

Specific examples of the sulfuric acid ester-based surfactant include lauryl sulfuric acid, myristyl sulfuric acid, and polyoxyethylene lauryl ether sulfuric acid.

(Cationic Surfactant)

Examples of the cationic surfactant include modified aliphatic polyamine (e.g., polyethylene polyamine).

(Nonionic Surfactant)

Examples of the nonionic surfactant include polyoxyalkylene alkyl ether (e.g., polyoxyethylene stearyl ether), polyoxyalkylene alkenyl ether (e.g., polyoxyethylene oleyl ether), polyoxyethylene alkyl phenyl ether (e.g., polyoxyethylene nonyl phenyl ether), polyoxyalkylene glycol (e.g., polyoxypropylene polyoxyethylene glycol), polyoxyalkylene monoalkylate (monoalkyl fatty acid ester polyoxyalkylene) (e.g., polyoxyethylene monoalkylates such as polyoxyethylene monostearate and polyoxyethylene monooleate), polyoxyalkylene dialkylate (dialkyl fatty acid ester polyoxyalkylene) (e.g., polyoxyethylene dialkylates such as polyoxyethylene distearate and polyoxyethylene dioleate), bispolyoxyalkylene alkylamide (e.g., bispolyoxyethylene stearylamide), sorbitan fatty acid ester, polyoxyethylene sorbitan fatty acid ester, polyoxyethylene alkylamine, glycerine fatty acid ester, oxyethylene-oxypropylene block copolymer, acetylene glycol-based surfactant, and acetylene-based polyoxyethylene oxide.

Of these, polyoxyethylene monoalkylate or polyoxyethylene dialkylate is preferred, and polyoxyethylene dialkylate is more preferred.

(Amphoteric Surfactant)

Examples of the amphoteric surfactant include carboxy betaine (e.g., alkyl-N,N-dimethylaminoacetic acid betaine and alkyl-N,N-dihydroxyethylaminoacetic acid betaine), sulfo betaine (e.g., alkyl-N,N-dimethylsulfoethylene ammonium betaine), imidazolinium betaine (e.g., 2-alkyl-N-carboxymethyl-N-hydroxyethylimidazolinium betaine), and alkylamine oxide (e.g., N,N-dimethylalkylamine oxide).

For the surfactant, the compounds described in paragraphs [0092] to [0096] of JP 2015-158662 A, paragraphs [0045] to [0046] of JP 2012-151273 A, and paragraphs [0014] to [0020] of JP 2009-147389 A can also be applied, and the contents thereof are incorporated in the present specification.

The cleaning liquid preferably contains the anionic surfactant. The anionic surfactants may be used singly or in combination of two or more. The cleaning liquid preferably contains two or more anionic surfactants because this leads to more excellent corrosion prevention performance.

For the anionic surfactant, preferred is at least one selected from the group consisting of the phosphoric acid ester-based surfactant, the sulfonic acid-based surfactant, the phosphonic acid-based surfactant, and the carboxylic acid-based surfactant, more preferred is the phosphoric acid ester-based surfactant or the sulfonic acid-based surfactant, and even more preferred is the phosphoric acid ester-based surfactant.

Those surfactants may be used singly or in combination of two or more. The cleaning liquid preferably contains two or more surfactants because this leads to more excellent corrosion prevention performance.

When the cleaning liquid contains the surfactant, the surfactant content (the total content when two or more surfactants are contained) is preferably 0.01 to 10.0 mass %, more preferably 0.05 to 5.0 mass % and even more preferably 0.1 to 3.0 mass % based on the total mass of the cleaning liquid.

Commercial products may be used as those surfactants.

<Reducing Agent (Oxygen Scavenger)>

The cleaning liquid may contain a reducing agent.

The reducing agent is a compound having an oxidative effect and having the function of oxidizing $OH^-$ ions or dissolved oxygen contained in the cleaning liquid, and is also called an oxygen scavenger.

The cleaning liquid preferably contains the reducing agent because this leads to excellent corrosion prevention performance.

The reducing agent used in the cleaning liquid is not particularly limited, and examples thereof include a hydroxylamine compound, an ascorbic acid compound, a catechol compound, and a reducing sulfur compound.

(Hydroxylamine Compound)

The cleaning liquid may contain a hydroxylamine compound as the reducing agent.

The hydroxylamine compound refers to at least one selected from the group consisting of hydroxylamine ($NH_2OH$), a hydroxylamine derivative, and their salts.

The hydroxylamine derivative refers to a compound of hydroxylamine ($NH_2OH$) obtained through substitution with at least one organic group.

A salt of hydroxylamine or a hydroxylamine derivative may be an inorganic or organic acid salt of hydroxylamine or a hydroxylamine derivative. For the salt of hydroxylamine or a hydroxylamine derivative, preferred is a salt thereof with an inorganic acid in which at least one non-metal selected from the group consisting of Cl, S, N and P is bonded to hydrogen, and more preferred is a hydrochloride, a sulfate, or a nitrate.

One example of the hydroxylamine compound is a compound represented by Formula (5).

[Chemical Formula 5]

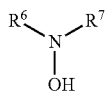

(5)

In the formula, $R^6$ and $R^7$ each independently represent a hydrogen atom or an alkyl group having 1 to 6 carbon atoms.

The alkyl groups each having 1 to 6 carbon atoms represented by $R^6$ and $R^7$ may be any of linear, branched and cyclic groups and may be the same or different.

For $R^6$ and $R^7$ in Formula (5), the alkyl group having 1 to 6 carbon atoms is preferred, an ethyl group or an n-propyl group is more preferred, and an ethyl group is even more preferred.

For the hydroxylamine compound, N-ethylhydroxylamine, DEHA, or N-n-propylhydroxylamine is preferred, and DEHA is more preferred.

The hydroxylamine compounds may be used singly or in combination of two or more. As the hydroxylamine compound, a commercial product or a composite suitably formed by a known method may be used.

(Ascorbic Acid Compound)

The cleaning liquid may contain an ascorbic acid compound as the reducing agent.

The ascorbic acid compound refers to at least one selected from the group consisting of ascorbic acid, an ascorbic acid derivative, and their salts.

Examples of the ascorbic acid derivative include an ascorbic acid phosphoric acid ester and an ascorbic acid sulfuric acid ester.

(Catechol Compound)

The cleaning liquid may contain a catechol compound as the reducing agent.

The catechol compound refers to at least one selected from the group consisting of pyrocatechol(benzene-1,2-diol) and a catechol derivative.

The catechol derivative refers to a compound of pyrocatechol obtained through substitution with at least one substituent. Examples of the substituent that the catechol derivative has include a hydroxy group, a carboxy group, a carboxylic acid ester group, a sulfo group, a sulfonic acid ester group, an alkyl group (preferably with 1 to 6 carbon atoms and more preferably with 1 to 4 carbon atoms), and an aryl group (preferably a phenyl group). The carboxy group and the sulfo group that the catechol derivative has as substituents may be salts with a cation. The alkyl group and the aryl group that the catechol derivative has as substituents may further have a substituent.

Examples of the catechol compound include pyrocatechol, 4-tert-butylcatechol, pyrogallol, gallic acid, methyl gallate, 1,2,4-benzenetriol, and tiron, with gallic acid being preferred.

(Reducing Sulfur Compound)

The cleaning liquid may contain a reducing sulfur compound as the reducing agent.

The reducing sulfur compound is not particularly limited as long as it contains a sulfur atom and functions as the reducing agent, and examples thereof include mercaptosuccinic acid, dithioglycerol, bis(2,3-dihydroxypropylthio)ethylene, sodium 3-(2,3-dihydroxypropylthio)-2-methyl-propylsulfonate, 1-thioglycerol, sodium 3-mercapto-1-propanesulfonate, 2-mercaptoethanol, thioglycolic acid, and 3-mercapto-1-propanol.

Of these, a compound having an SH group (mercapto compound) is preferred, 1-thioglycerol, sodium 3-mercapto-1-propanesulfonate, 2-mercaptoethanol, 3-mercapto-1-propanol, or thioglycolic acid is more preferred, and 1-thioglycerol or thioglycolic acid is even more preferred.

For the reducing agent, the hydroxylamine compound is preferred in terms of providing more excellent corrosion prevention performance with respect to a Cu- or Co-containing metal film, whereas the catechol compound is preferred in terms of providing more excellent corrosion prevention performance with respect to a W-containing metal film.

The reducing agents may be used singly or in combination of two or more. The cleaning liquid preferably contains two or more reducing agents because this leads to more excellent corrosion prevention performance with respect to a metal film (particularly a W-containing metal film).

When the cleaning liquid contains the reducing agent, the reducing agent content (the total content when two or more reducing agents are contained) is not particularly limited and is preferably 0.01 to 20 mass % and more preferably 0.1 to 15 mass % based on the total mass of the cleaning liquid.

Those reducing agents for use may be commercial products or composites formed by a known method.

<Quaternary Ammonium Compound>

The cleaning liquid may contain a quaternary ammonium compound.

The quaternary ammonium compound is not particularly limited as long as it is a quaternary ammonium cation-containing compound in which a nitrogen atom is attached to four hydrocarbon groups (preferably, alkyl groups) through substitution. Examples of the quaternary ammonium compound include quaternary ammonium hydroxide, quaternary ammonium fluoride, quaternary ammonium bromide, quaternary ammonium iodide, quaternary ammonium acetate, and quaternary ammonium carbonate.

It is preferable to contain the quaternary ammonium compound because this leads to more excellent corrosion prevention performance with respect to a Cu- or Co-containing metal film.

For the quaternary ammonium compound, preferred is quaternary ammonium hydroxide represented by Formula (6):

$$(R^8)_4N^+OH^- \quad (6)$$

In the formula, $R^8$ represents an alkyl group that may have a hydroxy group or a phenyl group as a substituent. Four $R^8$s may be the same or different.

For the alkyl group represented by $R^8$, an alkyl group having 1 to 4 carbon atoms is preferred, and a methyl group or an ethyl group is more preferred.

For the alkyl group that may have a hydroxy group or a phenyl group as represented by $R^8$, preferred is a methyl group, an ethyl group, a propyl group, a butyl group, a 2-hydroxyethyl group, or a benzyl group, more preferred is a methyl group, an ethyl group, a propyl group, a butyl group, or a 2-hydroxyethyl group, and even more preferred is a methyl group, an ethyl group, or a 2-hydroxyethyl group.

Examples of the quaternary ammonium compound include tetramethylammonium hydroxide (TMAH), trimethylethylammonium hydroxide (TMEAH), diethyldimethylammonium hydroxide (DEDMAH), triethylmethylammonium hydroxide (TEMAH), tetraethylammonium hydroxide (TEAR), tetrapropylammonium hydroxide (TPAH), tetrabutylammonium hydroxide (TBAH), 2-hydroxyethyl trimethylammonium hydroxide (choline), bis(2-hydroxyethyl)dimethylammonium hydroxide, tri(2-hydroxyethyl)methylammonium hydroxide, tetra(2-hydroxyethyl)ammonium hydroxide, benzyltrimethylammonium hydroxide (BTMAH), and cetyltrimethylammonium hydroxide.

As examples of the quaternary ammonium compound other than the foregoing specific examples, the compounds described in paragraph [0021] of JP 2018-107353 A can be applied, and the contents thereof are incorporated in the present description.

For the quaternary ammonium compound used for the cleaning liquid, TMAH, TMEAH, TEAR, TPAH, TBAH, choline, or bis(2-hydroxyethyl)dimethylammonium hydroxide is preferred, and TMEAH, TEAR, TPAH, or TBAH is more preferred.

The quaternary ammonium compound preferably has an asymmetric structure because this leads to more excellent damage resistance. The quaternary ammonium compound "having an asymmetric structure" means that four hydrocarbon groups attached to a nitrogen atom through substitution are different from one another.

Examples of the quaternary ammonium compound having an asymmetric structure include TMEAH, DMDEAH, TEMAH, choline, and bis(2-hydroxyethyl)dimethylammonium hydroxide, with TMEAH being preferred.

The quaternary ammonium compounds may be used singly or in combination of two or more. The cleaning liquid preferably contains two or more quaternary ammonium compounds because this leads to more excellent corrosion prevention performance with respect to a metal film (particularly a Cu-containing metal film).

When the cleaning liquid contains the quaternary ammonium compound, the content thereof is preferably 0.05 to 15 mass % and more preferably 0.1 to 10 mass % based on the total mass of the cleaning liquid.

<Additive>

The cleaning liquid may optionally contain other additives than the foregoing components. Examples of such additives include a pH adjuster, an anticorrosive, a polymer, a fluorine compound, and an organic solvent.

(pH Adjuster)

The cleaning liquid may contain a pH adjuster for adjusting and maintaining the pH of the cleaning liquid. Examples of the pH adjuster include a basic compound and an acidic compound other than the foregoing components.

Examples of the basic compound include a basic organic compound and a basic inorganic compound.

The basic organic compound is a compound different from any of the component A, the component B, the hydroxylamine compound, and the quaternary ammonium compound.

Examples of the basic inorganic compound include an alkali metal hydroxide and an alkaline earth metal hydroxide. Ammonia is not included in the basic inorganic compound.

Examples of the alkali metal hydroxide include lithium hydroxide, sodium hydroxide, potassium hydroxide, and cesium hydroxide. Examples of the alkaline earth metal hydroxide include calcium hydroxide, strontium hydroxide, and barium hydroxide.

The cleaning liquid may contain, other than the foregoing compounds, at least one selected from the group consisting of nitro, nitroso, oxime, ketoxime, aldoxime, nitrone, lactam, isocyanide compounds, hydrazide compounds such as carbohydrazide, and urea, as the basic compound.

The component A, the component B, the hydroxylamine compound, and/or the quaternary ammonium compound contained in the cleaning liquid may also serve as the basic compound for reducing the pH of the cleaning liquid.

Those basic compounds for use may be commercial products or composites suitably formed by a known method.

Examples of the acidic compound include an inorganic acid and an organic acid.

Examples of the inorganic acid include hydrochloric acid, sulfuric acid, sulfurous acid, nitric acid, nitrous acid, phosphoric acid, boric acid, and hexafluorophosphoric acid. Salts of the inorganic acids may also be used, and examples thereof include ammonium salts of the inorganic acids, more specifically, ammonium chloride, ammonium sulfate, ammonium sulfite, ammonium nitrate, ammonium nitrite, ammonium phosphate, ammonium borate, and ammonium hexafluorophosphate.

For the inorganic acid, phosphoric acid or a phosphate is preferred, and phosphoric acid is more preferred.

The organic acid is an organic compound having an acidic functional group and showing acidic properties (pH: less than 7.0) in an aqueous solution and is a compound that is not included in the chelating agent or the anionic surfactant described above. Examples of the organic acid include lower aliphatic monocarboxylic acids (with 1 to 4 carbon atoms) such as formic acid, acetic acid, propionic acid and butyric acid.

As the acidic compound, a salt of the acidic compound may be used as long as it forms an acid or an acid ion (anion) in an aqueous solution.

The chelating agent and/or anionic surfactant contained in the cleaning liquid may also serve as the acidic compound for increasing the pH of the cleaning liquid.

As the acidic compound, a commercial product or a composite suitably formed by a known method may be used.

The pH adjusters may be used singly or in combination of two or more.

When the cleaning liquid contains the pH adjuster, the content thereof is selected depending on the types and the amounts of other components and the pH of a target cleaning liquid, and is preferably 0.03 to 15 mass % and more preferably 0.1 to 13 mass % based on the total mass of the cleaning liquid.

The cleaning liquid may contain other anticorrosives than the foregoing components.

Exemplary other anticorrosives include sugars such as fructose, glucose, and ribose, polyols such as ethylene glycol, propylene glycol, and glycerin, polycarboxylic acids such as polyacrylic acid, polymaleic acid, and copolymers thereof, polyvinylpyrrolidone, cyanuric acid, barbituric acid and its derivatives, glucuronic acid, squaric acid, α-keto acid, adenosine and its derivatives, a purine compound and its derivatives, phenanthroline, resorcinol, hydroquinone, nicotinamide and its derivatives, flavonol and its derivatives, anthocyanin and its derivatives, and combinations thereof.

For the polymer, the water-soluble polymers described in paragraphs [0043] to [0047] of JP 2016-171294 A can be applied, and the contents thereof are incorporated in the present description.

For the fluorine compound, the compounds described in paragraphs [0013] to [0015] of JP 2005-150236 A can be applied, and the contents thereof are incorporated in the present description.

For the organic solvent, any of known organic solvents may be used, and hydrophilic organic solvents such as alcohols and ketones are preferred. The organic solvents may be used singly or in combination of two or more.

The amounts of the polymer, fluorine compound and organic solvent for use are not particularly limited and may be suitably specified in the ranges that do not impair the effects of the invention.

The contents of the respective components above in the cleaning liquid can be measured by known methods such as gas chromatography-mass spectrometry (GC-MS), liquid chromatography-mass spectrometry (LC-MS), and ion-exchange chromatography (IC).

[Physical Properties of Cleaning Liquid]

<pH>

The cleaning liquid shows alkaline properties. Specifically, the pH of the cleaning liquid is more than 7.0 at 25° C.

The pH of the cleaning liquid is preferably not less than 8.0, more preferably more than 9.0 and even more preferably more than 10.0 at 25° C. because this leads to more excellent cleaning performance. The upper limit of the pH of the cleaning liquid is not particularly limited and is preferably not more than 14.0 and more preferably not more than 13.0 at 25° C.

The pH of the cleaning liquid may be adjusted by using the foregoing pH adjusters as well as components functioning as the pH adjuster, such as the component A, the component B, the hydroxylamine compound, the quaternary ammonium compound, the chelating agent, the anionic surfactant, and the anticorrosive.

The pH of the cleaning liquid can be measured with a known pH meter by the method according to JIS Z 8802-1984.

<Flash Point>

The cleaning liquid preferably has a flash point of not lower than 60° C. and more preferably has no flash point in order to have a wider heatable range, which allows more efficient cleaning.

In this specification, the flash point refers to that measured according to JIS K 2265-2:2007, and the expression "has no flash point" means that ignition of a sample is not detected in the range of −30° C. to 300° C. when measurement is carried out with the above measurement method.

<Metal Content>

In the cleaning liquid, the content of each of metals (elemental metals Fe, Co, Na, K, Cu, Mg, Mn, Li, Al, Cr, Ni, Zn, Sn and Ag) contained as impurities in the liquid (calculated as the ion concentration) is preferably not more than 5 ppm by mass and more preferably not more than 1 ppm by mass. Since it is expected in manufacture of leading-edge semiconductor devices that a cleaning liquid with even higher purity should be required, the metal content is still more preferably less than 1 ppm by mass, that is, a value on the order of ppb by mass or less, and particularly preferably 100 ppb by mass or less. The lower limit thereof is not particularly limited and is preferably 0.

Exemplary methods of reducing the metal content include a refining treatment, such as distillation or filtration using ion-exchange resin or a filter, that is carried out in a stage of raw materials to be used in manufacturing the cleaning liquid or a stage after manufacture of the cleaning liquid.

Another method of reducing the metal content is the one using, as a container storing a raw material or the manufactured cleaning liquid, a container from which impurities are not largely leached, which will be described later. Still another method is providing lining of fluororesin on inner walls of pipes used in manufacture of the cleaning liquid in order to prevent metal components from being leached from the pipes.

<Coarse Particles>

The cleaning liquid may contain coarse particles but preferably in a small amount. The coarse particles herein refer to particles with a diameter (particle size) of 0.4 μm or more when the particle shape is assumed to be a sphere.

For the coarse particle content of the cleaning liquid, the content of particles with a particle size of 0.4 μm or more is preferably not more than 1000 particles and more preferably not more than 500 particles per milliliter of the cleaning liquid. The lower limit thereof is not particularly limited and is preferably 0. The content of particles with a particle size of 0.4 μm or more measured by one of the foregoing measurement methods is even more preferably at or below the detection limit.

The coarse particles contained in the cleaning liquid are particles of dust, dirt, organic and inorganic solid matter, and the like contained as impurities in raw materials and particles of dust, dirt, organic and inorganic solid matter, and the like entering as contaminations during preparation of the cleaning liquid, which particles remain present as particles in the cleaning liquid at the end without being dissolved.

The content of the coarse particles present in the cleaning liquid can be measured in a liquid phase with a commercial measurement device for a light scattering liquid-borne particle counting method using a laser as a light source.

One exemplary method of removing the coarse particles is a refining treatment such as filtration to be described later.

The cleaning liquid may take the form of a kit including raw materials of the cleaning liquid that are separated into plural units.

One exemplary method of having the cleaning liquid in the form of a kit involves preparing a liquid composition containing the component A and the component B as a first liquid and preparing a liquid composition containing the other components as a second liquid.

[Manufacture of Cleaning Liquid]

The cleaning liquid can be manufactured by a known method. The method of manufacturing the cleaning liquid is described below in detail.

<Liquid Preparation Step>

The method of preparing the cleaning liquid is not particularly limited, and for instance, the cleaning liquid can be manufactured by mixing the foregoing components. The order and/or timing of incorporating the foregoing components are not particularly limited; for instance, the component A and the component B as well as optional components such as the chelating agent, the surfactant, the reducing agent and/or the quaternary ammonium compound are sequentially added into a vessel containing purified pure water and then stirred, thereby preparing the cleaning liquid. When added to the vessel, water and those components may be added at one time or may be divided into plural portions and separately added.

A stirrer and a stirring method used in preparation of the cleaning liquid are not particularly limited, and a known device may be used as the stirrer or a disperser. Examples of the stirrer include an industrial mixer, a portable stirrer, a mechanical stirrer, and a magnetic stirrer. Examples of the disperser include an industrial disperser, a homogenizer, an ultrasonic disperser, and a bead mill.

Mixing of the components in the preparation step of the cleaning liquid, a refining treatment to be described later, and storage of the manufactured cleaning liquid are carried out at a temperature of preferably not higher than 40° C. and more preferably not higher than 30° C. At the same time, not lower than 5° C. is preferred, and not lower than 10° C. is more preferred. The preparation, the treatment and/or the storage of the cleaning liquid within the above temperature range makes it possible to maintain stable performance for a long period of time.

(Refining Treatment)

One or more of raw materials used in preparation of the cleaning liquid is preferably subjected to a refining treatment in advance. The refining treatment is not particularly limited, and examples thereof include known methods such as distillation, ion exchange, and filtration.

The degree of refining is not particularly limited, and a raw material is refined to a purity of preferably not less than 99 mass % and more preferably not less than 99.9 mass %.

Examples of specific methods of the refining treatment include a method in which a raw material is passed through ion-exchange resin or a reverse osmosis membrane (RO membrane), distillation of a raw material, and filtration to be described later.

As the refining treatment, the foregoing refining methods may be used in combination of two or more. For instance, a raw material may be firstly subjected to primary refinement in which the material is passed through a RO membrane and then to secondary refinement in which the material is passed through a refinement device made of cation exchange resin, anion exchange resin, or mixed-bed ion exchange resin. The refining treatment may be carried out plural times.

(Filtration)

A filter used in filtration is not particularly limited as long as it is of a type that has been conventionally used for filtration. Examples of the filter include filters made of fluororesins such as polytetrafluoroethylene (PTFE) and tetrafluoroethylene-perfluoroalkylvinylether copolymer (PFA), polyamide resins such as nylon, and polyolefin resins (including high density ones and ultra high molecular weight ones) such as polyethylene and polypropylene (PP). Preferred is a filter made of, of the above materials, a material selected from the group consisting of polyethylene, polypropylene (including high density polypropylene), fluororesin (including PTFE and PFA), and polyamide resin (including nylon), and more preferred is a filter made of fluororesin. By filtering a raw material with the filter made of such a material, foreign matter with high polarity that easily causes defects can be effectively removed.

The filter has a critical surface tension of preferably 70 to 95 mN/m and more preferably 75 to 85 mN/m. It should be noted that the value of the critical surface tension of the filter is a nominal value provided by its manufacturer. The use of the filter having a critical surface tension within the above range makes it possible to effectively remove foreign matter with high polarity that easily causes defects.

The filter has a pore size of preferably 2 to 20 nm and more preferably 2 to 15 nm. The pore size within the above range makes it possible to reliably remove fine foreign matter such as impurities and agglomerates contained in a raw material, while preventing clogging in filtration. The pore size herein can be determined by reference to a nominal value of the relevant filter manufacturer.

Filtration may be carried out only one time or two or more times. When filtration is carried out two or more times, the filters used may be the same or different.

Filtration is carried out preferably at room temperature (25° C.) or lower, more preferably at 23° C. or lower, and even more preferably at 20° C. or lower, and at the same time, preferably at 0° C. or higher, more preferably at 5° C. or higher, and even more preferably at 10° C. or higher. Filtration at a temperature within the foregoing range makes it possible to reduce the amounts of particulate foreign matter and impurities dissolved in a raw material and effectively remove foreign matter and impurities.

(Container)

The cleaning liquid (including an embodiment of a kit or a diluted solution to be described later) can be put into a given container and stored, transported and used as long as problems such as corrosion do not occur.

For the container, preferred is a container which has high cleanliness in its interior and in which leaching of impurities from the inner wall of a storage portion of the container to the liquid is suppressed, for semiconductor applications. Examples of such a container include various containers commercially available as containers for semiconductor cleaning liquids, as exemplified by, but not limited to, the "Clean Bottle" series manufactured by Aicello Corporation and "Pure Bottle" manufactured by Kodama Plastics Co., Ltd.

For the container storing the cleaning liquid, preferred is a container whose portion to contact the liquid, such as the inner wall of its storage portion, is formed from fluororesin (perfluororesin) or metal having undergone a rust proof and metal leaching prevention treatment.

The inner wall of the container is preferably formed from one or more resins selected from the group consisting of polyethylene resin, polypropylene resin, and polyethylene-polypropylene resin, or another resin different therefrom, or a metal having undergone a rust proof and metal leaching prevention treatment such as stainless steel, Hastelloy, Inconel, or Monel.

For another resin above, fluororesin (perfluororesin) is preferred. When such a container with its inner wall being formed from fluororesin is used, defects such as leaching of oligomers of ethylene or propylene can be suppressed as compared to a container with its inner wall being formed from polyethylene resin, polypropylene resin, or polyethylene-polypropylene resin.

Specific examples of such a container with its inner wall being formed from fluororesin include FluoroPure PFA composite drums manufactured by Entegris, Inc. In addition, the containers described in page 4 of JP 3-502677 A, page 3 of the specification of WO 2004/016526, and pages 9 and 16 of the specification of WO 99/046309 may also be used.

In addition to the foregoing fluororesin, quartz and an electrolytically polished metal material (i.e., a metal material having undergone electrolytic polishing) may also be preferably used for the inner wall of the container.

For a metal material used in manufacture of the foregoing electrolytically polished metal material, preferred is a metal material containing at least one selected from the group consisting of chromium and nickel, with the total content of chromium and nickel being more than 25 mass % based on the total mass of the metal material; examples of the metal material include a stainless steel and a nickel-chromium alloy.

The total content of chromium and nickel in the metal material is more preferably not less than 30 mass % based on the total mass of the metal material.

The upper limit of the total content of chromium and nickel in the metal material is not particularly limited and is preferably not more than 90 mass %.

The method of electrolytic polishing of the metal material is not particularly limited, and any known methods may be used. For instance, the methods described in paragraphs [0011] to [0014] of JP 2015-227501 A and paragraphs [0036] to [0042] of JP 2008-264929 A may be used.

Preferably, the inside of the containers is washed before being filled with the cleaning liquid. For a liquid used for washing, the amount of metal impurities in the liquid is preferably reduced in advance. After being manufactured, the cleaning liquid may be bottled in such containers as gallon bottles or quart bottles, transported and stored.

In order to prevent the components in the cleaning liquid from changing during storage, the inside of each container may be replaced with an inert gas (nitrogen, argon or the like) having a purity of not less than 99.99995 vol % in advance. In particular, a gas with a low moisture content is preferred. While the transportation and the storage may be carried out at normal temperature, the temperature may be controlled to fall within the range of $-20°$ C. to $20°$ C. to prevent the change of properties.

(Cleanroom)

It is preferable to conduct all of manufacture of the cleaning liquid, opening and washing of the containers, handling of the cleaning liquid such as filling, process and treatment analyses, and measurements in a cleanroom. The cleanroom preferably satisfies ISO (International Organization for Standardization) 14644-1 cleanroom standards. In particular, the cleanroom satisfies more preferably one of ISO Class 1, ISO Class 2, ISO Class 3, and ISO Class 4, even more preferably ISO Class 1 or ISO Class 2, and particularly preferably ISO Class 1.

<Dilution Step>

The cleaning liquid is subjected to a dilution step in which the liquid is diluted with a diluent such as water and then used in cleaning of semiconductor substrates.

The dilution ratio of the cleaning liquid in the dilution step may be adjusted as appropriate depending on the types and contents of the components and the type of semiconductor substrates to be cleaned, and the ratio of the diluted cleaning liquid to the cleaning liquid before dilution is preferably 10 to 1000 times and more preferably 30 to 300 times in mass ratio.

The cleaning liquid is diluted preferably with water because this leads to more excellent cleaning performance.

The change in pH of the cleaning liquid from that before dilution to that after dilution (a difference between the pH of the cleaning liquid before dilution and that after dilution) is preferably not more than 1.0, more preferably not more than 0.8 and even more preferably not more than 0.5.

The pH of the diluted cleaning liquid is preferably more than 7.0 and more preferably not less than 7.5 at $25°$ C. The upper limit of the pH of the diluted cleaning liquid is preferably not more than 12.5, more preferably not more than 11.5 and even more preferably not more than 10.5 at $25°$ C.

A specific method of diluting the cleaning liquid in the dilution step is not particularly limited, and the dilution step may be carried out according to the liquid preparation step of the cleaning liquid described above. A stirrer and a stirring method used in the dilution step are also not particularly limited, and stirring may be carried out with a known stirrer whose examples are listed in the liquid preparation step of the cleaning liquid described above.

Water used in the dilution step is preferably subjected to a refining treatment in advance. Preferably, the diluted cleaning liquid obtained in the dilution step is subjected to a refining treatment.

The refining treatment is not particularly limited, and examples thereof include an ionic component reduction treatment using ion-exchange resin or a RO membrane, and removal of foreign matter through filtration, which are described above as examples of the refining treatment for the cleaning liquid; preferably, one of these treatments is carried out.

The component A content of the diluted cleaning liquid is preferably 0.0005 to 0.15 mass % and more preferably 0.005 to 0.12 mass % based on the total mass of the diluted cleaning liquid.

The component B content of the diluted cleaning liquid is preferably 0.0000001 to 0.001 mass % and more preferably 0.000001 to 0.0005 mass % based on the total mass of the diluted cleaning liquid.

When the diluted cleaning liquid contains the chelating agent, the chelating agent content is preferably 0.00001 to 0.25 mass %, more preferably 0.0001 to 0.18 mass % and even more preferably 0.0005 to 0.1 mass % based on the total mass of the diluted cleaning liquid.

When the diluted cleaning liquid contains the surfactant, the surfactant content is preferably 0.0001 to 0.1 mass %, more preferably 0.0005 to 0.05 mass % and even more preferably 0.001 to 0.03 mass % based on the total mass of the diluted cleaning liquid.

When the diluted cleaning liquid contains the reducing agent, the reducing agent content is preferably 0.0001 to 0.2 mass % and more preferably 0.001 to 0.15 mass % based on the total mass of the diluted cleaning liquid.

When the diluted cleaning liquid contains the quaternary ammonium compound, the quaternary ammonium compound content is preferably 0.0005 to 0.15 mass % and more preferably 0.001 to 0.1 mass % based on the total mass of the cleaning liquid.

When the cleaning liquid contains the chelating agent, it is also preferable that, after the liquid preparation step as above, the cleaning liquid be subjected to a concentration step to prepare a concentrated liquid through concentration and then to the dilution step as above.

The method of concentrating the cleaning liquid in the concentration step is not particularly limited as long as the performance of the cleaning liquid is not impaired, and concentration can be carried out by a known method such as distillation.

The concentration ratio of the cleaning liquid in the concentration step may be suitably adjusted depending on the types and the contents of the components, and the ratio of the concentrated liquid to the cleaning liquid before concentration is preferably 1/5 to 1/500 times and more preferably 1/10 to 1/300 times in mass ratio.

[Cleaning Method]

The cleaning method of the present invention includes a cleaning step of cleaning a semiconductor substrate having undergone a chemical mechanical polishing (CMP) process. The cleaning liquid described above is used in cleaning of semiconductor substrates having undergone the CMP process. The temperature of the cleaning liquid applied in cleaning of semiconductor substrates is not lower than 30° C., as described later.

[Cleaning Object]

In the cleaning method, metal-containing matter on a semiconductor substrate having undergone the CMP process is removed by cleaning the semiconductor substrate with the above-described cleaning liquid. That is, one example of a cleaning object in the cleaning method is a semiconductor substrate having metal-containing matter.

The expression "on a semiconductor substrate" in this specification includes places on the top, bottom and lateral sides of the semiconductor substrate and in a groove of the semiconductor substrate. The metal-containing matter on a semiconductor substrate includes not only metal-containing matter present directly on a surface of the semiconductor substrate but also metal-containing matter present on or above the semiconductor substrate via another layer.

A metal contained in the metal-containing matter is for instance at least one metal M selected from the group consisting of Cu (copper), Co (cobalt), Ti (titanium), Ta (tantalum), Ru (ruthenium), W (tungsten), Cr (chromium), Hf (hafnium), Os (osmium), Pt (platinum), Ni (nickel), Mn (manganese), Cu (copper), Zr (zirconium), Mo (molybdenum), La (lanthanum), and Ir (iridium).

The metal-containing matter is not limited as long as it is a substance containing a metal (metallic atom), and examples thereof include a simple substance of the metal M, an alloy containing the metal M, an oxide of the metal M, a nitride of the metal M, and an oxynitride of the metal M.

The metal-containing matter may be a mixture containing two or more of those compounds.

The oxide, the nitride and the oxynitride above may be a composite oxide, a composite nitride and a composite oxynitride each of which contains a metal.

The metallic atom content of the metal-containing matter is preferably not less than 10 mass %, more preferably not less than 30 mass % and even more preferably not less than 50 mass % based on the total mass of the metal-containing matter. The upper limit thereof is 100 mass % because the metal-containing matter may be exactly the metal itself.

The semiconductor substrate has preferably the metal-containing matter (i.e., matter containing the metal M), more preferably the metal-containing matter containing at least one metal selected from the group consisting of Cu, Co, Ti, Ta, Ru, and W, and even more preferably the metal-containing matter containing at least one metal selected from the group consisting of Co, Ti, Ta, Ru, and W.

The semiconductor substrate that is a cleaning object to be cleaned with the cleaning liquid is not particularly limited, and examples thereof include one having a metal wiring film, a barrier metal, and an insulating film on a surface of a wafer constituting the semiconductor substrate.

Specific examples of the wafer constituting the semiconductor substrate include wafers made of silicon-based materials such as a silicon (Si) wafer, a silicon carbide (SiC) wafer, and a silicon-containing resin wafer (glass epoxy wafer), a gallium phosphide (GaP) wafer, a gallium arsenide (GaAs) wafer, and an indium phosphide (InP) wafer.

Applicable examples of the silicon wafer include an n-type silicon wafer in which a silicon wafer is doped with a pentavalent atom (e.g., phosphorus (P), arsenic (As), and antimony (Sb)), and a p-type silicon wafer in which a silicon wafer is doped with a trivalent atom (e.g., boron (B), and gallium (Ga)). Silicon of the silicon wafer may be any of, for example, amorphous silicon, monocrystalline silicon, polycrystalline silicon, and polysilicon.

In particular, the cleaning liquid is useful for wafers made of silicon-based materials such as a silicon wafer, a silicon carbide wafer, and a silicon-containing resin wafer (glass epoxy wafer).

The semiconductor substrate may have an insulating film on the wafer described above.

Specific examples of the insulating film include silicon oxide films (e.g., a silicon dioxide ($SiO_2$) film and a tetraethyl orthosilicate ($Si(OC_2H_5)_4$) film (TEOS film)), silicon nitride films (e.g., a silicon nitride ($Si_3N_4$) film and a silicon nitride/carbide (SiNC) film), and low dielectric (Low-k) films (e.g., a carbon-doped silicon oxide (SiOC) film and a silicon carbide (SiC) film).

Examples of a metal film that the semiconductor substrate has on a surface of the wafer include a film primarily composed of copper (Cu) (copper-containing film), a film primarily composed of cobalt (Co) (cobalt-containing film), a film primarily composed of tungsten (W) (tungsten-containing film), and a metal film constituted of an alloy including one or more selected from the group consisting of Cu, Co and W.

Examples of the copper-containing film include a wiring film composed only of metallic copper (copper wiring film) and a wiring film made of an alloy composed of metallic copper and other metals (copper alloy wiring film).

Specific examples of the copper alloy wiring film include a wiring film made of an alloy composed of copper and one or more metals selected from aluminum (Al), titanium (Ti), chromium (Cr), manganese (Mn), tantalum (Ta) and tungsten (W). More specifically, examples thereof include a copper-aluminum alloy wiring film (CuAl alloy wiring film), a copper-titanium alloy wiring film (CuTi alloy wiring film), a copper-chromium alloy wiring film (CuCr alloy wiring film), a copper-manganese alloy wiring film (CuMn alloy wiring film), a copper-tantalum alloy wiring film (CuTa alloy wiring film), and a copper-tungsten alloy wiring film (CuW alloy wiring film).

Examples of the cobalt-containing film (a metal film primarily composed of cobalt) include a metal film composed only of metallic cobalt (cobalt metal film) and a metal film made of an alloy composed of metallic cobalt and other metals (cobalt alloy metal film).

Specific examples of the cobalt alloy metal film include a metal film made of an alloy composed of cobalt and one or more metals selected from titanium (Ti), chromium (Cr), iron (Fe), nickel (Ni), molybdenum (Mo), palladium (Pd), tantalum (Ta) and tungsten (W). More specifically, examples thereof include a cobalt-titanium alloy metal film (CoTi alloy metal film), a cobalt-chromium alloy metal film (CoCr alloy metal film), a cobalt-iron alloy metal film (CoFe alloy metal film), a cobalt-nickel alloy metal film (CoNi alloy metal film), a cobalt-molybdenum alloy metal film (CoMo alloy metal film), a cobalt-palladium alloy metal film (CoPd alloy metal film), a cobalt-tantalum alloy metal film (CoTa alloy metal film), and a cobalt-tungsten alloy metal film (CoW alloy metal film).

The cleaning liquid is useful for the substrate having the cobalt-containing film. Of the cobalt-containing films, the cobalt metal film is often used as a wiring film, and the cobalt alloy metal film is often used as a barrier metal.

In some cases, it is preferable to use the cleaning liquid in cleaning of the semiconductor substrate having at least the copper-containing wiring film and the metal film (cobalt barrier metal), which is composed only of metallic cobalt and is a barrier metal of the copper-containing wiring film, on or above the wafer constituting the substrate, with the copper-containing wiring film and the cobalt barrier metal being in contact with each other at a surface of the substrate.

Examples of the tungsten-containing film (a metal film primarily composed of tungsten) include a metal film composed only of metallic tungsten (tungsten metal film) and a metal film made of an alloy composed of tungsten and other metals (tungsten alloy metal film).

Examples of the tungsten alloy metal film include a tungsten-titanium alloy metal film (WTi alloy metal film) and a tungsten-cobalt alloy metal film (WCo alloy metal film).

The tungsten-containing film is often used as a barrier metal.

The methods of forming the foregoing insulating film, copper-containing wiring film, cobalt-containing film and tungsten-containing film on the wafer constituting the semiconductor substrate are not particularly limited as long as they are known methods used in this field.

One exemplary method of forming the insulating film is a method in which the wafer constituting the semiconductor substrate is subjected to a heating treatment in the presence of oxygen gas to form a silicon oxide film, whereafter silane and ammonia gases are introduced to form a silicon nitride film by a chemical vapor deposition (CVD) method.

Exemplary methods of forming the copper-containing wiring film, the cobalt-containing film and the tungsten-containing film include a method in which a circuit is formed on the wafer having the above insulating film by a known method using a resist for instance, whereafter the copper-containing wiring film, the cobalt-containing film and the tungsten-containing film are formed by plating, the CVD method, or another process.

<CMP Process>

The CMP process is, for instance, a process for planarizing a surface of the substrate having the metal wiring film, the barrier metal and the insulating film through a combination of a chemical action induced by use of a polishing slurry containing fine abrasive particles (abrasive grains) and mechanical polishing.

Abrasive grains (e.g., silica and alumina) used in the CMP process, metal impurities (metal residues) derived from the polished metal wiring film and barrier metal, and other impurities sometimes remain on the surface of the semiconductor substrate having undergone the CMP process. These impurities may cause short circuit between wirings and adversely affect electric characteristics of the semiconductor substrate; therefore, the semiconductor substrate having undergone the CMP process is subjected to a cleaning treatment to remove these impurities from the surface of the semiconductor substrate.

One specific example of the semiconductor substrate having undergone the CMP process is not limited to but includes a substrate having undergone the CMP process described in Journal of the Japan Society for Precision Engineering, Vol. 84, No. 3, 2018.

[Method of Cleaning Semiconductor Substrate]

The method of cleaning semiconductor substrates is not particularly limited as long as it is a method involving a step of cleaning the semiconductor substrate by bringing the cleaning liquid having a temperature of not lower than 30° C. into contact with a surface of the semiconductor substrate having undergone the CMP process.

In the method of cleaning semiconductor substrates according to the present invention, the temperature of the cleaning liquid applied to the semiconductor substrate in the cleaning step is not lower than 30° C. While not bound by any theory, it is believed that in the cleaning method of the invention, applying the cleaning liquid with high temperature which is not lower than 30° C. to the semiconductor substrate brings about improvement in residue removal performance of the component B described above, thus further improving cleaning performance. The temperature of the cleaning liquid applied to the semiconductor substrate is preferably not lower than 35° C. and more preferably not lower than 40° C. because this leads to more excellent cleaning performance.

The upper limit of the temperature of the cleaning liquid is not particularly limited and is preferably less than 80° C., more preferably less than 70° C. and even more preferably less than 60° C. because this leads to more excellent corrosion prevention performance. While not bound by any theory, it is believed that the temperature of the cleaning liquid not exceeding the upper limit value as above allows a corrosion prevention film formed from the component A to be maintained, thus further improving corrosion prevention performance.

The temperature of the cleaning liquid applied to the semiconductor substrate herein refers to the temperature of the cleaning liquid when the cleaning liquid is brought into contact with the semiconductor substrate.

The method of adjusting the temperature of the cleaning liquid applied to the semiconductor substrate is not particularly limited, and one method is that the cleaning liquid before being used for cleaning is heated with a known heating device such as a heater such that the cleaning liquid can have a target temperature during cleaning.

The cleaning step of cleaning the semiconductor substrate with the cleaning liquid is not particularly limited as long as it is a known method used for semiconductor substrates having undergone the CMP process, and the cleaning step is preferably brush scrubbing cleaning that, while supplying the cleaning liquid to the semiconductor substrate, brings a cleaning member such as a brush into physical contact with a surface of the semiconductor substrate to remove residues and the like.

The brush scrubbing cleaning is a cleaning method in which the semiconductor substrate is cleaned while being held between two brushes. The rotation speeds of the two brushes may be the same or different. In the brush scrubbing cleaning, what is rotated may be the semiconductor substrate. The brush rotation speed is preferably 10 to 500 revolutions per minute (rpm) and more preferably 30 to 300 rpm. The rotation speed of the semiconductor substrate is preferably 10 to 300 rpm and more preferably 30 to 200 rpm.

The method of cleaning in the cleaning step is not limited to the brush scrubbing cleaning, and there may be suitably employed any known method in this field such as an immersion method in which the semiconductor substrate is immersed in the cleaning liquid, a spinning (dropping)

method in which the cleaning liquid is dropped while the semiconductor substrate is rotated, or a spraying method in which the cleaning liquid is sprayed. In cleaning by the immersion method, the cleaning liquid having the semiconductor substrate immersed therein is preferably subjected to an ultrasonic treatment because this can further reduce impurities remaining on the surface of the semiconductor substrate.

The cleaning step may be carried out only one time or two or more times. When the cleaning step is carried out two or more times, the same method may be repeated or different methods may be combined.

The method of cleaning the semiconductor substrate to be employed may be any of a single wafer process and a batch process. The single wafer process is a method in which semiconductor substrates are treated one by one, while the batch process is a method in which a plurality of semiconductor substrates are treated at one time.

The amount of supply (feed rate) of the cleaning liquid in the cleaning step (preferably the brush scrubbing cleaning) of the semiconductor substrate is not particularly limited and is preferably 50 to 5000 mL/min and more preferably 500 to 2000 mL/min.

While the cleaning time in the cleaning step of the semiconductor substrate depends on the types and the contents of components in the cleaning liquid and therefore cannot be unconditionally stated, the cleaning time is preferably not less than 5 seconds, more preferably not less than 10 seconds, and even more preferably not less than 15 seconds because this leads to more excellent cleaning performance. The upper limit thereof is not particularly limited and is preferably not more than 5 minutes, more preferably less than 3 minutes, even more preferably not more than 2 minutes, and particularly preferably not more than 1 minute because this leads to more excellent corrosion prevention performance.

The difference (absolute value) between the temperature of the semiconductor substrate subjected to cleaning and the temperature of the cleaning liquid applied to the semiconductor substrate is preferably not more than 10° C., more preferably not more than 8° C., and even more preferably not more than 5° C. With the temperature difference between the semiconductor substrate and the cleaning liquid falling within the above range, it is possible to suppress a variation in cleaning performance among plural semiconductor substrates subjected to cleaning or a variation in cleaning performance that may vary depending on the position in one semiconductor substrate.

In cleaning of the semiconductor substrate, a mechanical stirring method may be used to further enhance the cleaning ability of the cleaning liquid.

Examples of the mechanical stirring method include a method involving circulating the cleaning liquid on the semiconductor substrate, a method involving flowing or spraying the cleaning liquid on the semiconductor substrate, and a method involving stirring the cleaning liquid by ultrasonics or megasonics.

The cleaning of the semiconductor substrate may be followed by a step of rinsing and washing the semiconductor substrate with a solvent (hereinafter called "rinsing step").

The rinsing step is preferably a step that consecutively follows the cleaning step of the semiconductor substrate and that is carried out with a rinsing solvent (rinsing liquid) for 5 seconds to 5 minutes. The rinsing step may be carried out using the mechanical stirring method as above.

Examples of the rinsing solvent include water (preferably deionized (DI) water), methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid with a pH of more than 8 (e.g., a diluted aqueous ammonium hydroxide) may be used.

The forgoing method of bringing the cleaning liquid into contact with the semiconductor substrate is applicable as the method of bringing the rinsing solvent into contact with the semiconductor substrate in the same manner.

The rinsing step may be followed by a drying step for drying the semiconductor substrate.

The drying method is not particularly limited, and examples thereof include spin drying, a method involving flowing dry gas on the semiconductor substrate, a method involving heating the substrate by a heating means such as a hot plate or an infrared lamp, Marangoni drying, Rotagoni drying, isopropyl alcohol (IPA) drying, and any combinations thereof.

EXAMPLES

The present invention is described below in further detail based on examples. The materials, amounts of use, and ratios stated in examples below may be suitably modified as long as they do not depart from the scope and spirit of the present invention. Therefore, the scope of the present invention should not be construed as being limited to the examples below.

In the examples below, the pH values of cleaning liquids were measured at 25° C. with a pH meter (type: F-74, manufactured by HORIBA, Ltd.) according to JIS Z 8802-1984.

In manufacture of cleaning liquids of Examples and Comparative Examples, handling of containers and preparation, filling, storage, analysis and measurement of the cleaning liquids were all conducted in a cleanroom with the level satisfying ISO Class 2 or lower class. In measurement of the metal content of a cleaning liquid, when the content of a substance at or below the detection limit was measured, the measurement was carried out after the cleaning liquid was concentrated to 1/100 in terms of volume, and the measurement result was converted into a value of the metal content of the liquid at the concentration before the liquid was concentrated, in order to improve the measurement accuracy.

[Raw Materials of Cleaning Liquid]
[Component A]
The following compounds were used as the component A in manufacture of cleaning liquids.
  2-Amino-2-methyl-1-propanol (AMP): manufactured by FUJIFILM Wako Pure Chemical Corporation
  2-(Methylamino)-2-methyl-1-propanol (N-MAMP): manufactured by FUJIFILM Wako Pure Chemical Corporation
  Monoethanolamine (MEA): manufactured by FUJIFILM Wako Pure Chemical Corporation
  Diethanolamine (DEA): manufactured by FUJIFILM Wako Pure Chemical Corporation
  Tris(hydroxymethyl)aminomethane (Tris): manufactured by FUJIFILM Wako Pure Chemical Corporation
  Diethylene glycol amine (DEGA): manufactured by FUJIFILM Wako Pure Chemical Corporation
  Ethylenediamine (EDA): manufactured by FUJIFILM Wako Pure Chemical Corporation
  1,3-Propanediamine (PDA): manufactured by FUJIFILM Wako Pure Chemical Corporation Diethylenetriamine (DETA): manufactured by FUJIFILM Wako Pure Chemical Corporation Triethylenetriamine (TETA): manufactured by FUJIFILM Wako Pure Chemical Corporation N-(2-Aminoethyl)piperazine (AEP): manufactured by FUJIFILM Wako Pure Chemical Corporation 1,4-Bis(2-hydroxyethyl)piperazine (BHEP): manufactured by FUJIFILM Wako Pure Chemical Corporation 1,4-Bis(3-aminopropyl)piperazine (BAPP): manufactured by FUJIFILM Wako Pure Chemical Corporation Bis(aminopropyl)ethylenediamine (BAPEDA: manufactured by FUJIFILM Wako Pure Chemical Corporation Triethanolamine (TEA): manufactured by FUJIFILM Wako Pure Chemical Corporation

[Component B]

The following compounds were used as the component B in manufacture of cleaning liquids.

Ethylamine: manufactured by FUJIFILM Wako Pure Chemical Corporation

Triethylamine: manufactured by FUJIFILM Wako Pure Chemical Corporation

Propylamine: manufactured by FUJIFILM Wako Pure Chemical Corporation

Ammonia water ($NH_3$): manufactured by FUJIFILM Wako Pure Chemical Corporation

[Chelating Agent]

The following compounds were used as the chelating agent in manufacture of cleaning liquids.

Diethylenetriaminepentaacetic acid (DTPA): manufactured by FUJIFILM Wako Pure Chemical Corporation N,N,N',N'-Ethylenediaminetetrakis(methylenephosphonic acid) (EDTPO): "Dequest 2066" manufactured by Thermphos Glycine: manufactured by FUJIFILM Wako Pure Chemical Corporation Citric acid: manufactured by Fuso Chemical Co., Ltd.

Iminodiacetic acid (IDA): manufactured by FUJIFILM Wako Pure Chemical Corporation Cysteine: manufactured by FUJIFILM Wako Pure Chemical Corporation 1-Hydroxyethylidene-1,1-diphosphonic acid (HEDP): "Dequest 2000" manufactured by Thermphos

[Surfactant]

The following compounds were used as the surfactant in manufacture of cleaning liquids.

Cetyl phosphoric acid ester (AP16): anionic surfactant, manufactured by FUJIFILM Wako Pure Chemical Corporation Stearyl phosphoric acid ester (AP18): anionic surfactant, manufactured by FUJIFILM Wako Pure Chemical Corporation Lauryl phosphoric acid ester (AP12): anionic surfactant, "Phosten HLP" manufactured by Nikko Chemicals Co., Ltd.

[Reducing Agent]

Diethylhydroxylamine (DEHA): manufactured by FUJIFILM Wako Pure Chemical Corporation Gallic acid: manufactured by FUJIFILM Wako Pure Chemical Corporation

[Quaternary Ammonium Compound]

Tetraethyl ammonium hydroxide (TEAH): manufactured by FUJIFILM Wako Pure Chemical Corporation Tetrapropylammonium hydroxide (TPAH): manufactured by FUJIFILM Wako Pure Chemical Corporation Tetrabutylammonium hydroxide (TBAH): manufactured by FUJIFILM Wako Pure Chemical Corporation Trimethylethylammonium hydroxide (TMEAH): manufactured by FUJIFILM Wako Pure Chemical Corporation In addition, commercial ultrapure water (manufactured by FUJIFILM Wako Pure Chemical Corporation) was used in manufacture of cleaning liquids in Examples and in the dilution step of the cleaning liquids.

[Manufacture of Cleaning Liquid]

Next, a method of manufacturing a cleaning liquid is described taking Example 1 as an example.

To ultrapure water, AMP as the component A, ethylamine as the component B, DTPA as the chelating agent, and AP16 as the surfactant were added in respective amounts as stated in Table 1. The resulting mixture was sufficiently stirred with a stirrer, thereby obtaining a cleaning liquid of Example 1.

Cleaning liquids of Examples 2 to 43 and Comparative Examples 1 to 3 with the compositions shown in Tables 1 and 2 were manufactured according to the manufacturing method of Example 1.

The "Amount" columns in Tables 1 and 2 provide the amounts of the respective components contained based on the total mass of the relevant cleaning liquid.

In Tables 1 and 2, the values in the "Ratio 1" column each represent a mass ratio of the component B content to the component A content (the total content when plural components A were used).

In Tables 1 and 2, the values in the "Ratio 2" column each represent a mass ratio of the component A content (the total content when plural components A were used) to the chelating agent content (the total content when plural chelating agents were used).

In Tables 1 and 2, the values in the "Cleaning liquid pH" column each represent pH of the relevant cleaning liquid at 25° C. measured with the above pH meter.

[Evaluation of Corrosion Prevention Performance]

The cleaning liquid of each of Examples and Comparative Examples in an amount of 2 mL was taken and diluted with ultrapure water at the dilution ratio (volume ratio) stated in the "Dilution ratio" column in Tables 1 and 2 to prepare a sample of a diluted cleaning liquid.

A wafer (diameter: 12 inches) having on its surface a metal film made of copper, cobalt or tungsten was cut to prepare a wafer coupon of 2 cm square. The thickness of each metal film was set to 200 nm. The temperature of the sample of the diluted cleaning liquid manufactured by the foregoing method was adjusted to the temperature shown in the "Cleaning liquid temperature" column in Tables 1 and 2. The wafer was immersed in the thus obtained sample at 40° C. and subjected to a 15-second immersion treatment at a stirring rotation speed of 250 rpm. For each metal film, the film thicknesses before and after the immersion treatment were calculated, and the corrosion rate per unit time was calculated from the calculation results. Each cleaning liquid was evaluated for the corrosion prevention performance according to the following evaluation criteria. The results thereof are shown in Tables 1 and 2.

Note that a lower corrosion rate indicates better corrosion prevention performance of the cleaning liquid.

"A": A corrosion rate of not more than 0.5 Å/min

"B": A corrosion rate of more than 0.5 Å/min and not more than 1.0 Å/min

"C": A corrosion rate of more than 1.0 Å/min and not more than 3.0 Å/min

"D": A corrosion rate of more than 3.0 Å/min

[Evaluation of Cleaning Performance]

A sample of a diluted cleaning liquid was prepared using the cleaning liquid of each of Examples and Comparative Examples in the same manner as in the evaluation of the corrosion prevention performance above. Using the diluted cleaning liquid thus obtained, evaluation was made on defect suppression performance when the metal film having undergone chemical mechanical polishing was cleaned.

A wafer (diameter: 8 inches) having on its surface a metal film made of copper, cobalt or tungsten was polished with FREX 200 (a polishing apparatus, manufactured by Ebara Corporation). As the polishing slurry, CSL5220C (commercial name, manufactured by FUJIFILM Planar Solutions LLC.) was used for a wafer having a Cu-containing film and a wafer having a Co-containing film, and W2000 (commercial name, manufactured by Cabot Corporation) was used for a wafer having a W-containing film. The polishing pressure was 2.0 psi, and the feed rate of the polishing slurry was 0.28 mL/(min·cm$^2$). The polishing time was 60 seconds.

Thereafter, the polished wafer was subjected to brush scrubbing cleaning for 30 seconds by use of the sample of the diluted cleaning liquid whose temperature was adjusted to the temperature shown in the "Cleaning liquid temperature" column in Tables 1 and 2. In this process, the amount of supply of the cleaning liquid was 1200 mL/min, and the temperature of the wafer that was the cleaning object was 38° C.

Then, the cleaned wafer was dried.

The number of defects at a polished surface of the obtained wafer was detected with a defect detection apparatus (ComPlus II, manufactured by Applied Materials, Inc.), and the cleaning liquid was evaluated for the cleaning performance according to the following evaluation criteria. The results thereof are shown in Tables 1 and 2. A smaller number of defects detected at the polished surface of a wafer means that the generation of defects caused by residues is suppressed, and thus, the cleaning performance can be evaluated to be more excellent.

"A": The number of defects being not more than 50 per wafer
"B": The number of defects being more than 50 and not more than 200 per wafer
"C": The number of defects being more than 200 and not more than 500 per wafer
"D": The number of defects being more than 500 per wafer

TABLE 1

| | Composition of cleaning liquid | | | | | | | | | | | | |
|---|---|---|---|---|---|---|---|---|---|---|---|---|---|
| | Component A | | Component A | | Component B | | | Chelating agent | | | | Surfactant | |
| Table1 | Type | Amount (%) | Type | Amount (%) | Type | Amount (%) | Ratio 1 | Type | Amount (%) | Type | Amount (%) | Ratio 2 | Type | Amount (%) |
| EX 1 | AMP | 3.0 | | | Ethylamine | 3.3E−04 | 1.1E−04 | DTPA | 0.04 | | | 75.0 | AP16 | 0.075 |
| EX 2 | AMP | 3.0 | | | Ethylamine | 1.0E−02 | 3.3E−03 | DTPA | 0.8 | | | 3.8 | AP16 | 1.5 |
| EX 3 | AMP | 3.0 | | | Ethylamine | 5.0E−03 | 1.7E−03 | DTPA | 1.0 | | | 3.0 | AP16 | 1.9 |
| EX 4 | AMP | 3.0 | | | Ethylamine | 3.0E−02 | 1.0E−02 | DTPA | 1.1 | | | 2.8 | AP16 | 2.0 |
| EX 5 | AMP | 3.0 | | | Ethylamine | 5.0E−03 | 1.7E−03 | EDTPO | 3.0 | | | 1.0 | AP16 | 1.5 |
| EX 6 | AMP | 3.0 | | | Ethylamine | 8.0E−03 | 2.7E−03 | DTPA | 0.8 | | | 3.8 | AP16 | 1.5 |
| EX 7 | AMP | 3.0 | | | Ethylamine | 4.0E−03 | 1.3E−03 | DTPA | 0.8 | Glycine | 0.4 | 2.5 | AP16 | 1.5 |
| EX 8 | AMP | 3.0 | | | Ethylamine | 3.0E−03 | 1.0E−03 | DTPA | 0.8 | Glycine | 0.4 | 2.5 | AP16 | 1.5 |
| EX 9 | AMP | 3.0 | | | Ethylamine | 2.0E−03 | 6.7E−04 | Citric acid | 0.8 | | | 3.8 | AP16 | 1.5 |
| EX 10 | AMP | 3.0 | | | Ethylamine | 4.0E−03 | 1.3E−03 | IDA | 0.4 | | | 7.5 | AP16 | 1.5 |
| EX 11 | AMP | 3.0 | | | Ethylamine | 1.0E−03 | 3.3E−04 | IDA | 0.4 | | | 7.5 | AP16 | 1.5 |
| EX 12 | AMP | 3.0 | | | Ethylamine | 5.0E−03 | 1.7E−03 | IDA | 0.4 | | | 7.5 | AP16 | 1.5 |
| | | | | | | | | | | | | | AP18 | 0.5 |
| EX 13 | AMP | 3.0 | | | Ethylamine | 2.0E−02 | 6.7E−03 | EDTPO | 3.0 | | | 1.0 | — | — |
| EX 14 | AMP | 3.0 | | | Ethylamine | 1.0E−02 | 3.3E−03 | HEDP | 0.8 | | | 3.8 | — | — |
| EX 15 | AMP | 3.0 | | | Ethylamine | 1.6E−02 | 5.3E−03 | DTPA | 0.8 | Glycine | 0.4 | 2.5 | — | — |
| EX 16 | AMP | 3.0 | | | Ethylamine | 1.6E−02 | 5.3E−03 | DTPA | 0.8 | Glycine | 0.4 | 2.5 | — | — |
| EX 17 | AMP | 3.0 | | | Ethylamine | 5.0E−03 | 1.7E−03 | Citric acid | 0.8 | | | 3.8 | — | — |
| EX 18 | AMP | 3.0 | | | Ethylamine | 4.0E−03 | 1.3E−03 | IDA | 0.4 | | | 7.5 | — | — |
| EX 19 | AMP | 3.0 | N-MAMP | 0.24 | Ethylamine | 1.0E−03 | 3.1E−04 | DTPA | 0.8 | Glycine | 0.4 | 2.7 | AP18 | 1.5 |
| EX 20 | AMP | 3.0 | N-MAMP | 4.0 | Ethylamine | 1.0E−03 | 1.4E−04 | DTPA | 0.8 | Glycine | 0.4 | 5.8 | AP18 | 1.5 |
| EX 21 | AMP | 3.0 | N-MAMP | 3.0 | Ethylamine | 1.0E−03 | 1.7E−04 | DTPA | 0.8 | Glycine | 0.4 | 5.0 | AP18 | 1.5 |
| EX 22 | AMP | 3.0 | N-MAMP | 2.0 | Ethylamine | 1.0E−03 | 2.0E−04 | DTPA | 0.8 | Glycine | 0.4 | 4.2 | AP18 | 1.5 |
| EX 23 | AMP | 3.0 | N-MAMP | 1.0 | Ethylamine | 5.0E−03 | 1.3E−03 | DTPA | 0.8 | Glycine | 0.4 | 3.3 | AP18 | 1.5 |
| EX 24 | MEA | 3.0 | | | Ethylamine | 3.0E−03 | 1.0E−03 | DTPA | 0.8 | Glycine | 0.4 | 2.5 | AP16 | 1.5 |
| EX 25 | DEA | 3.0 | | | Ethylamine | 4.0E−03 | 1.3E−03 | DTPA | 0.8 | Glycine | 0.4 | 2.5 | AP16 | 1.5 |

EX: Example

TABLE 2

| Table 1 (continuation) | Composition of cleaning liquid (continuation) | | | | | | | | Evaluation | | | | | |
|---|---|---|---|---|---|---|---|---|---|---|---|---|---|---|
| | Reducing agent | | Quaternary ammonium compound | | Water Amount | Cleaning liquid | Cleaning liquid Dilution | Cleaning temperature | Cleaning time | Corrosion prevention performance Cleaning object | | | Cleaning performance Cleaning object | | |
| | Type | Amount (%) | Type | Amount (%) | (%) | pH | ratio | (° C.) | (sec) | Cu | W | Co | Cu | W | Co |
| EX 1 | — | — | — | — | 96.9 | 11.5 | 150 | 40 | 15 | B | B | B | B | B | B |
| EX 2 | — | — | — | — | 94.7 | 11.5 | 100 | 40 | 15 | B | B | B | A | A | A |
| EX 3 | — | — | — | — | 94.1 | 11.5 | 100 | 40 | 15 | B | B | B | A | A | A |
| EX 4 | — | — | — | — | 93.9 | 11.5 | 100 | 40 | 15 | B | C | C | B | B | B |
| EX 5 | — | — | — | — | 92.5 | 11.3 | 100 | 40 | 15 | B | B | B | A | A | A |
| EX 6 | — | — | — | — | 94.7 | 11.6 | 100 | 40 | 15 | B | B | B | A | A | A |
| EX 7 | — | — | — | — | 94.3 | 11.7 | 100 | 40 | 15 | B | B | B | A | A | A |
| EX 8 | — | — | TEAH | 5.0 | 89.3 | 13.0 | 100 | 40 | 15 | A | B | A | A | A | A |
| EX 9 | — | — | — | — | 94.7 | 11.8 | 100 | 40 | 15 | B | B | B | A | A | A |
| EX 10 | — | — | — | — | 95.1 | 11.8 | 100 | 40 | 15 | B | B | B | A | A | A |
| EX 11 | — | — | TPAH | 1.0 | 94.1 | 12.1 | 100 | 40 | 15 | A | B | A | A | A | A |
| EX 12 | — | — | — | — | 94.6 | 11.8 | 100 | 40 | 15 | A | A | A | A | A | A |
| EX 13 | DEHA | 4.0 | — | — | 90.0 | 11.2 | 100 | 40 | 15 | A | B | A | A | A | A |
| EX 14 | DEHA | 4.0 | — | — | 92.2 | 11.5 | 100 | 40 | 15 | A | B | A | A | A | A |
| EX 15 | DEHA | 4.0 | — | — | 91.8 | 11.6 | 100 | 40 | 15 | A | B | A | A | A | A |
| EX 16 | DEHA Gallic acid | 4.0 6.0 | — | — | 85.8 | 12.9 | 100 | 40 | 15 | A | A | A | A | A | A |
| EX 17 | DEHA | 4.0 | — | — | 92.2 | 11.7 | 100 | 40 | 15 | A | B | A | A | A | A |
| EX 18 | DEHA | 4.0 | — | — | 92.6 | 11.7 | 100 | 40 | 15 | A | B | A | A | A | A |
| EX 19 | — | — | — | — | 94.1 | 11.5 | 100 | 40 | 15 | A | A | A | A | A | A |
| EX 20 | — | — | — | — | 90.3 | 11.5 | 100 | 40 | 15 | A | A | A | A | A | A |
| EX 21 | — | — | — | — | 91.3 | 11.5 | 100 | 40 | 15 | A | A | A | A | A | A |
| EX 22 | — | — | — | — | 92.3 | 11.5 | 100 | 40 | 15 | A | A | A | A | A | A |
| EX 23 | — | — | — | — | 93.3 | 11.5 | 100 | 40 | 15 | A | A | A | A | A | A |
| EX 24 | — | — | — | — | 94.3 | 11.2 | 100 | 40 | 15 | A | B | B | A | A | A |
| EX 25 | — | — | — | — | 94.3 | 10.5 | 100 | 40 | 15 | B | B | B | A | A | A |

EX: Example

TABLE 3

| Table 2 | Composition of cleaning liquid | | | | | | | | | | | | | |
|---|---|---|---|---|---|---|---|---|---|---|---|---|---|---|
| | Component A | | | | Component B | | | Chelating agent | | | | | Surfactant | |
| | Type | Amount (%) | Type | Amount (%) | Type | Amount (%) | Ratio 1 | Type | Amount (%) | Type | Amount (%) | Ratio 2 | Type | Amount (%) |
| EX 26 | Tris | 3.0 | | | Ethylamine | 4.0E-03 | 1.3E-03 | DTPA | 0.8 | Glycine | 0.4 | 2.5 | AP16 | 1.5 |
| EX 27 | Tris | 3.0 | | | Ethylamine | 4.0E-03 | 1.3E-03 | DTPA | 0.8 | Glycine | 0.4 | 2.5 | AP16 | 1.5 |
| EX 28 | DEGA | 3.0 | | | Triethyl-amine | 4.0E-03 | 1.3E-03 | DTPA | 0.8 | Glycine | 0.4 | 2.5 | AP16 | 1.5 |
| EX 29 | DEGA | 3.0 | | | Triethyl-amine | 4.0E-03 | 1.3E-03 | DTPA | 0.8 | Cysteine | 0.4 | 2.5 | AP16 | 1.5 |
| EX 30 | DEGA | 3.0 | | | Triethyl-amine | 5.0E-03 | 1.7E-03 | DTPA | 0.8 | Glycine | 0.4 | 2.5 | AP16 | 1.5 |
| EX 31 | DEGA | 3.0 | | | Triethyl-amine | 5.0E-03 | 1.7E-03 | DTPA | 0.8 | Glycine | 0.4 | 2.5 | AP16 | 1.5 |
| EX 32 | EDA | 3.0 | | | Ethylamine | 1.0E-02 | 3.3E-03 | DTPA | 0.8 | Glycine | 0.4 | 2.5 | AP16 | 1.5 |
| EX 33 | PDA | 3.0 | | | Propyl-amine | 5.0E-03 | 1.7E-03 | DTPA | 0.8 | Glycine | 0.4 | 2.5 | AP16 | 1.5 |
| EX 34 | DETA | 3.0 | | | Ethylamine | 3.0E-02 | 1.0E-02 | DTPA | 0.8 | Glycine | 0.4 | 2.5 | AP16 | 1.5 |
| EX 35 | TETA | 3.0 | | | Ethylamine | 2.0E-03 | 6.7E-04 | DTPA | 0.8 | Glycine | 0.4 | 2.5 | AP16 | 1.5 |
| EX 36 | AEP | 3.0 | | | Ethylamine | 5.0E-03 | 1.7E-03 | DTPA | 0.8 | Glycine | 0.4 | 2.5 | AP16 | 1.5 |
| EX 37 | BHEP | 3.0 | | | Ethylamine | 1.0E-02 | 3.3E-03 | DTPA | 0.8 | Glycine | 0.4 | 2.5 | AP16 | 1.5 |
| EX 38 | BAPP | 3.0 | | | Propyl-amine | 8.0E-03 | 2.7E-03 | DTPA | 0.8 | Glycine | 0.4 | 2.5 | AP16 | 1.5 |
| EX 39 | BAPEDA | 3.0 | | | Propyl-amine | 1.0E-02 | 3.3E-03 | DTPA | 0.8 | Glycine | 0.4 | 2.5 | AP16 | 1.5 |
| EX 40 | AMP | 3.0 | N-MAMP | 4.0 | Ethylamine | 3.0E-02 | 4.3E-03 | DTPA | 15.0 | Glycine | 4.0 | 0.4 | AP12 | 1.5 |
| EX 41 | AMP | 3.0 | N-MAMP | 4.0 | Ethylamine | 7.0E-03 | 1.0E-03 | DTPA | 10.0 | Glycine | 3.0 | 0.5 | AP12 | 1.5 |
| EX 42 | AMP | 3.0 | N-MAMP | 4.0 | Ethylamine | 1.0E-02 | 1.4E-03 | DTPA | 5.0 | Glycine | 2.0 | 1.0 | AP12 | 1.5 |
| EX 43 | AMP | 3.0 | | | $NH_3$ | 3.0E-03 | 1.0E-03 | DTPA | 0.8 | Glycine | 0.4 | 2.5 | AP12 | 1.5 |

TABLE 3-continued

| | | | | | | | | | | | | |
|---|---|---|---|---|---|---|---|---|---|---|---|---|
| | colspan="4" | Composition of cleaning liquid | | | | | | | | | | |
| | colspan="2" | Component A | colspan="2" | Component B | | | colspan="4" | Chelating agent | | | colspan="2" | Surfactant |
| Table 2 | Type | Amount (%) | Type | Amount (%) | Type | Amount (%) | Ratio 1 | Type | Amount (%) | Type | Amount (%) | Ratio 2 | Type | Amount (%) |

| Table 2 | Type | Amount (%) | Type | Amount (%) | Type | Amount (%) | Ratio 1 | Type | Amount (%) | Type | Amount (%) | Ratio 2 | Type | Amount (%) |
|---|---|---|---|---|---|---|---|---|---|---|---|---|---|---|
| CE 1 | TEA | 0.75 | | | Ethylamine | 5.0E−05 | 6.7E−05 | HEDP | 0.5 | | | 1.5 | — | — |
| CE 2 | TEA | 3.5 | | | | | | HEDP | 0.04 | | | 87.5 | — | — |
| CE 3 | TEA | 1.5 | | | Ethylamine | 5.0E−01 | 3.3E−01 | HEDP | 0.04 | | | 37.5 | — | — |

EX: Example
CE: Comparative Example

TABLE 4

| | Composition of cleaning liquid (continuation) | | | | | | | | Evaluation | | | | | |
|---|---|---|---|---|---|---|---|---|---|---|---|---|---|---|
| | Reducing agent | | Quaternary ammonium compound | | Water | Cleaning | Cleaning | Cleaning | Corrosion prevention performance | | | Cleaning performance | | |
| Table 2 (continuation) | | Amount | | Amount | Amount | liquid | Dilution | temperature | time | Cleaning object | | | Cleaning object | | |
| | Type | (%) | Type | (%) | (%) | pH | ratio | (° C.) | (sec) | Cu | W | Co | Cu | W | Co |
| EX 26 | — | — | — | — | 94.3 | 8.5 | 100 | 40 | 15 | C | A | C | A | A | A |
| EX 27 | — | — | TBAH | 10.0 | 84.3 | 13.0 | 100 | 40 | 15 | A | A | A | A | A | A |
| EX 28 | — | — | — | — | 94.3 | 9.5 | 100 | 40 | 15 | B | A | B | A | A | A |
| EX 29 | — | — | — | — | 94.3 | 9.5 | 100 | 40 | 15 | A | A | A | A | A | A |
| EX 30 | — | — | TMEAH | 2.0 | 92.3 | 10.5 | 100 | 40 | 15 | B | A | A | A | A | A |
| EX 31 | — | — | TMEAH TEAH | 2.0 5.0 | 87.3 | 13.0 | 100 | 40 | 15 | A | A | A | A | A | A |
| EX 32 | — | — | — | — | 94.3 | 12.0 | 100 | 40 | 15 | B | C | B | A | A | A |
| EX 33 | — | — | — | — | 94.3 | 12.0 | 100 | 40 | 15 | A | A | A | A | A | A |
| EX 34 | — | — | — | — | 94.3 | 11.5 | 100 | 40 | 15 | A | A | A | A | A | A |
| EX 35 | — | — | — | — | 94.3 | 11.5 | 100 | 40 | 15 | A | A | A | A | A | A |
| EX 36 | — | — | — | — | 94.3 | 11.0 | 100 | 40 | 15 | A | A | A | A | A | A |
| EX 37 | — | — | — | — | 94.3 | 11.0 | 100 | 40 | 15 | A | A | A | A | A | A |
| EX 38 | — | — | — | — | 94.3 | 11.0 | 100 | 40 | 15 | A | A | A | A | A | A |
| EX 39 | — | — | — | — | 94.3 | 11.0 | 100 | 40 | 15 | A | A | A | A | A | A |
| EX 40 | — | — | — | — | 72.5 | 9.0 | 100 | 40 | 15 | C | B | C | A | A | A |
| EX 41 | — | — | — | — | 78.5 | 10.0 | 100 | 40 | 15 | B | A | B | A | A | A |
| EX 42 | — | — | — | — | 84.5 | 11.0 | 100 | 40 | 15 | A | A | A | A | A | A |
| EX 43 | — | — | — | — | 94.3 | 10.5 | 100 | 40 | 15 | C | A | A | C | A | A |
| CE 1 | DEHA | 4.0 | | | 94.7 | 8.5 | 100 | 25 | 15 | A | A | A | D | D | D |
| CE 2 | DEHA | 4.0 | | | 92.5 | 11.5 | 100 | 40 | 15 | A | A | A | D | D | D |
| CE 3 | DEHA | 4.0 | | | 94.0 | 11.5 | 100 | 40 | 15 | D | D | D | A | A | A |

EX: Example
CE: Comparative Example

As evident from Tables 1 and 2, it was confirmed that the cleaning method of the invention results in both excellent cleaning performance and excellent corrosion prevention performance.

It was confirmed that when the cleaning liquid contains two or more components A, the corrosion prevention performance is more excellent (comparison between Examples 7 and 19 to 23).

It was confirmed that when the component A is MEA, AMP, N-MAMP, DEA, DEGA, EDA, PDA, DETA, TETA, AEP, BHEP, BAPP, or BAPEDA, the corrosion prevention performance with respect to a Cu- or Co-containing metal film is more excellent, and when the component A is MEA, PDA, DETA, TETA, AEP, BHEP, BAPP, or BAPEDA, the corrosion prevention performance with respect to a Cu- or Co-containing metal film is even more excellent (comparison between Examples 7, 26, 28 and 32 to 39).

It was also confirmed that when the component A is MEA, AMP, N-MAMP, DEA, DEGA, Tris, PDA, DETA, TETA, AEP, BHEP, BAPP, or BAPEDA, the corrosion prevention performance with respect to a W-containing metal film is more excellent, and when the component A is DEGA, Tris, PDA, DETA, TETA, AEP, BHEP, BAPP, or BAPEDA, the corrosion prevention performance with respect to a W-containing metal film is even more excellent (comparison between Examples 7, 26, 28 and 32 to 39).

It was confirmed that when the component B contains an alkyl group having 1 to 3 carbon atoms, the corrosion prevention performance and cleaning performance with respect to a Cu-containing metal film are more excellent (comparison between Examples 8 and 43).

It was confirmed that when the component B is ammonia ($NH_3$), the corrosion prevention performance with respect to a W-containing metal film is more excellent (comparison between Examples 8 and 43).

It was confirmed that when the mass ratio of the component B content to the component A content is not more than 0.005, the corrosion prevention performance with respect to a W- or Co-containing metal film and the cleaning performance are more excellent (comparison between Examples 3 and 4).

It was confirmed that when the mass ratio of the component B content to the component A content is not less than 0.0005, the cleaning performance is more excellent (comparison between Examples 1 and 2).

It was confirmed that when the cleaning liquid contains a sulfur-containing amino acid as the chelating agent, the corrosion prevention performance with respect to a Cu- or Co-containing metal film is more excellent (comparison between Examples 28 and 29).

It was confirmed that when the mass ratio of the component A content to the chelating agent content is more than 0.4, the corrosion prevention performance is more excellent, and when the mass ratio thereof is not less than 0.6, the corrosion prevention performance with respect to a Cu- or Co-containing metal film is even more excellent (comparison between Examples 40 to 42).

It was confirmed that when the cleaning liquid contains two or more surfactants, the corrosion prevention performance is more excellent (comparison between Examples 10 and 12).

It was confirmed that when the cleaning liquid contains two or more reducing agents, the corrosion prevention performance with respect to a W-containing metal film is more excellent (comparison between Examples 15 and 16).

It was confirmed that when the cleaning liquid contains the quaternary ammonium compound, the corrosion prevention performance with respect to a Cu- or Co-containing metal film is excellent (comparison between Examples 7 and 8, and comparison between Examples 10 and 11, for instance).

It was confirmed that when the cleaning liquid contains two or more quaternary ammonium compounds, the corrosion prevention performance with respect to a Cu-containing metal film is excellent (comparison between Examples 30 and 31).

[Evaluation of Temperature and Feed Rate of Cleaning Liquid]

The corrosion prevention performance and the cleaning performance were evaluated using the cleaning liquid of Example 29 in the same manner as the foregoing methods for evaluating the corrosion prevention performance and the cleaning performance except that the temperature of the sample of the diluted cleaning liquid used in cleaning and the cleaning time were set to those shown in the "Cleaning liquid temperature" column and the "Cleaning time" column of Table 3.

In Examples 101 to 108, a cleaning liquid with the same composition as that of the cleaning liquid of Example 29 was used. The results are shown in Tables 3.

TABLE 5

| Table 3 | Cleaning liquid temperature (° C.) | Cleaning time (sec) | Corrosion prevention performance Cleaning object | | | Cleaning performance Cleaning object | | |
|---|---|---|---|---|---|---|---|---|
| | | | Cu | W | Co | Cu | W | Co |
| EX 29 | 40 | 30 | A | A | A | A | A | A |
| EX 101 | 30 | 30 | A | A | A | B | B | B |
| EX 102 | 60 | 30 | A | A | A | A | A | A |
| EX 103 | 70 | 30 | B | B | B | A | A | A |
| EX 104 | 80 | 30 | C | C | C | A | A | A |
| EX 105 | 40 | 5 | A | A | A | C | C | C |
| EX 106 | 40 | 60 | A | A | A | A | A | A |

TABLE 5-continued

| Table 3 | Cleaning liquid temperature (° C.) | Cleaning time (sec) | Corrosion prevention performance Cleaning object | | | Cleaning performance Cleaning object | | |
|---|---|---|---|---|---|---|---|---|
| | | | Cu | W | Co | Cu | W | Co |
| EX 107 | 40 | 120 | A | A | A | A | A | A |
| EX 108 | 40 | 180 | A | A | A | B | B | B |

EX: Example

As evident from Table 3, it was confirmed that with the temperature and the cleaning time within the above-described ranges, the cleaning method of the invention results in both excellent cleaning performance and excellent corrosion prevention performance.

It was confirmed that when the cleaning liquid temperature is not lower than 35° C., the cleaning performance with respect to a metal film is more excellent (comparison between Examples 29 and 101).

It was confirmed that when the cleaning liquid temperature is lower than 80° C., the corrosion prevention performance with respect to a metal film is more excellent, and when the cleaning liquid temperature is lower than 70° C., the corrosion prevention performance with respect to a metal film is even more excellent (comparison between Examples 102 to 104).

It was confirmed that when the cleaning time is not less than 10 seconds, the cleaning performance with respect to a metal film is more excellent (comparison between Examples 29 and 105).

It was confirmed that when the cleaning time is less than 180 seconds, the cleaning performance with respect to a metal film is more excellent (comparison between Examples 107 and 108).

What is claimed is:

1. A method of cleaning semiconductor substrates, the method comprising a cleaning step of cleaning a semiconductor substrate having undergone a chemical mechanical polishing process using a cleaning liquid,
    wherein the pH of the cleaning liquid is not less than 10.5 at 25° C. and the cleaning liquid contains:
        a component A that is at least one selected from the group consisting of a primary amine, a secondary amine, a tertiary amine, and their salts, provided that a compound represented by Formula (a) is excluded; and
        a component B that is a compound represented by Formula (a),
    wherein a mass ratio of a content of the component B to a content of the component A is not more than 0.01, and
    wherein the cleaning liquid applied to the semiconductor substrate has a temperature of not lower than 30° C., $$NH_xR_{(3-x)} \qquad (a)$$

where R represents an alkyl group having 1 to 3 carbon atoms that is composed of hydrogen atoms and a carbon atom or atoms, and x represents an integer of 0 to 3.

2. The method according to claim 1, wherein the component A contains an amino alcohol.

3. The method according to claim 2, wherein a first acidity constant of a conjugated acid of the amino alcohol is not less than 7.0.

4. The method according to claim 2, wherein the amino alcohol has a primary amino group.

5. The method according to claim 2, wherein the amino alcohol has a quaternary carbon atom at an α position of an amino group.

6. The method according to claim 2, wherein the amino alcohol is 2-amino-2-methyl-1-propanol.

7. The method according to claim 1, wherein the cleaning liquid contains two or more compounds included in the component A.

8. The method according to claim 1, wherein the cleaning liquid further contains a chelating agent.

9. The method according to claim 1, wherein the cleaning liquid further contains a reducing agent.

10. The method according to claim 1, wherein the cleaning liquid further contains two or more reducing agents.

11. The method according to claim 1, wherein the cleaning liquid further contains a quaternary ammonium compound.

12. The method according to claim 11, wherein the quaternary ammonium compound has an asymmetric structure.

13. The method according to claim 1, wherein the cleaning liquid further contains two or more quaternary ammonium compounds.

14. The method according to claim 1, wherein the cleaning liquid further contains a surfactant.

15. The method according to claim 1, wherein the cleaning liquid further contains two or more surfactants.

16. The method according to claim 1, wherein the semiconductor substrate has metal-containing matter containing at least one metal selected from the group consisting of cobalt, titanium, tantalum, ruthenium, and tungsten.

17. The method according to claim 1, wherein an amount of supply of the cleaning liquid applied to the semiconductor substrate is 500 to 2000 mL/min.

18. The method according to claim 1, wherein the cleaning step comprises brush scrubbing cleaning.

19. The method according to claim 1, wherein a cleaning time in the cleaning step is 10 to 120 seconds.

20. The method according to claim 1, further comprising a rinsing step of rinsing the semiconductor substrate with water after the cleaning step.

21. The method according to claim 1, wherein a content of the component A is 0.05 to 15 mass % based on the total mass of the cleaning liquid, and a content of the component B is 0.00001 to 0.1 mass % based on the total mass of the cleaning liquid.

* * * * *